(12) United States Patent
Lee

(10) Patent No.: US 8,198,167 B2
(45) Date of Patent: Jun. 12, 2012

(54) METHOD OF MANUFACUTURING SEMICONDUCTOR MEMORY APPARATUS AND SEMICONDUCTOR MEMORY APPARATUS MANUFACTURED THEREBY

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 441 days.

(21) Appl. No.: 12/254,729

(22) Filed: Oct. 20, 2008

(65) Prior Publication Data

US 2009/0294976 A1    Dec. 3, 2009

(30) Foreign Application Priority Data

May 30, 2008  (KR) ..................... 10-2008-0050940

(51) Int. Cl.
*H01L 21/20* (2006.01)
(52) U.S. Cl. ............ 438/381; 438/396; 257/E27.084; 257/E21.646
(58) Field of Classification Search ...... 438/3, 238–340, 438/253, 254, 250, 396–399, 381; 257/E27.084, 257/E21.646
See application file for complete search history.

(56) References Cited

U.S. PATENT DOCUMENTS

| 6,037,216 A * | 3/2000 | Liu et al. ................ 438/253 |
| 6,294,426 B1 * | 9/2001 | Tu et al. ................ 438/255 |

FOREIGN PATENT DOCUMENTS

| KR | 10-2000-0007644 | 2/2000 |
| KR | 10-2004-0008620 | 1/2004 |
| KR | 10-2004-0014840 | 2/2004 |
| KR | 10-2004-0055483 | 6/2004 |

* cited by examiner

*Primary Examiner* — Brook Kebede
(74) *Attorney, Agent, or Firm* — Marshall, Gerstein & Borun LLP

(57) ABSTRACT

A method of manufacturing a semiconductor memory apparatus includes fabricating a cell array to reduce parasitic capacitance generated between a bit line and a gate pattern. The method may include determining a plug region by a storage-node plug contact mask and a bit line plug mask. The method may further include: forming a gate pattern of a cell transistor and depositing an insulation layer over a structure including the gate pattern; and forming a hard mask layer over the insulation layer.

17 Claims, 31 Drawing Sheets

METHOD OF MANUFACUTURING SEMICONDUCTOR MEMORY APPARATUS AND SEMICONDUCTOR MEMORY APPARATUS MANUFACTURED THEREBY

CROSS-REFERENCES TO RELATED APPLICATIONS

Priority is claimed to Korean patent application number 10-2008-0050940, filed on May 30, 2008, which is incorporated by reference in its entirety.

BACKGROUND OF THE INVENTION

The present invention relates to a method of manufacturing a semiconductor memory apparatus of high integration, and more specifically, to a method of forming a plurality of unit cells and bit lines included in a cell array of a semiconductor memory apparatus.

Generally, a semiconductor is a material that belongs to a category of material intermediate a conductor and nonconductor according to classification of materials depending on electric conductivity. Although the semiconductor is similar to the nonconductor in a pure state, addition of impurities or other manipulation can increase the electric conductivity of the semiconductor. Impurities are added to the semiconductor, which is then connected to the conductor so as to be used to generate a semiconductor device such as a transistor. A semiconductor apparatus refers to an apparatus having various functions made of the semiconductor device. A semiconductor memory apparatus is a representative example of the semiconductor apparatus.

A type of semiconductor memory apparatus includes a plurality of unit cells each including a capacitor and a transistor. A double capacitor has been used to temporarily store data. A transistor has been used to transmit data between a bit line and a capacitor corresponding to a control signal (word line) using the electric conductivity of the semiconductor that changes depending on environment. The transistor has three regions including a gate, a source and a drain, where charges between the source and drain move in response to a control signal inputted to the gate. The charges between the source and the drain move through a channel region in accordance with the properties and operation of the semiconductor.

When a transistor is formed in a semiconductor substrate, a gate is formed in the semiconductor substrate, and impurities are doped at both sides of the gate to form a source and a drain. Due to increase of data capacity and integration of a semiconductor memory apparatus, the size of each unit cell is required to be smaller. That is, the design rule of the capacitor and the transistor included in the unit cell is decreased. As a result, a channel length of the cell transistor becomes shorter, which causes a short channel effect and a drain induced barrier lower (DIBL) effect that hinders a normal operation. For preventing the short channel effect and the DIBL effect, the doping concentration of the channel region has been increased to obtain a threshold voltage required in the cell transistor. However, as the design rule is decreased to less than 100 nm, the increase of the doping concentration in the channel region increases an electric field of a storage node (SN) junction to degrade a refresh characteristic of the semiconductor memory apparatus. In order to prevent the degradation of the refresh characteristic, a cell transistor having a three-dimensional structure is used. As a result, it is possible to secure a long channel length of the cell transistor vertically even as the design rule is decreased. Moreover, if the channel length of the cell transistor is secured, the doping concentration is decreased to prevent the degradation of the refresh characteristic. Hereinafter, a process for forming a saddle-type fin transistor used as a cell transistor having a three-dimensional structure is described.

FIGS. 1a to 1f are plane diagrams illustrating a mask pattern for forming a cell array included in a general semiconductor memory apparatus.

FIG. 1a shows when several masks used in forming a cell array are overlapped. Specifically, the masks used in forming a cell array include an ISO mask (see FIG. 1b) for defining an active region, a gate mask (see FIG. 1d) for defining a gate region of a cell transistor, a fin mask (see FIG. 1c) for defining a lower gate fin region of a saddle-type fin transistor as a cell transistor, a plug mask (see FIG. 1e) for defining a region where a plug contact is formed, a bit line contact mask (see FIG. 1f) for defining a region where a bit line contact is formed, and a bit line mask (see FIG. 1f) for defining a bit line.

Referring to FIG. 1a, the ISO masks are arranged in a cross-section (I-I') of a first X-axis. The plug masks shown in FIG. 1e, the bit line contact masks and the bit line masks shown in FIG. 1f are arranged in a cross-section (II-II') of a second X-axis. The bit line contact masks shown in FIG. 1f are arranged in a cross-section (III-III') of a first Y-axis. The fin masks shown in FIG. 1e and the gate masks shown in FIG. 1d are not all formed in cross-sections (III-III, IV-IV') of first and second Y axes.

Although the plug mask shown in FIG. 1e is formed in the same shape as compared to the ISO mask, the plug mask may move within a given distance ('F' shown in FIG. 2e) defined in the design rule toward the Y-axis. Referring to FIG. 1f, the bit line mask covers the bit line contact mask (polygonal pattern).

FIGS. 2a to 2h are cross-sectional diagrams illustrating a method for forming a cell array in the semiconductor memory apparatus using a plurality of masks shown in FIGS. 1a to 1f.

Referring to FIG. 2a, a Shallow Trench Isolation (STI) process is performed to form a device isolation film 202 in a semiconductor substrate 201. The semiconductor substrate 201 and the device isolation film 202 are etched with the fin mask shown in FIG. 1c to form a fin region of the saddle-type fin transistor. After a gate oxide film 203 is formed over the fin region, a hard mask oxide film 206 is formed. The hard mask oxide film 206 is etched with the gate mask shown in FIG. 1d to deposit a gate electrode 204 over the etched space. After planarization, a hard mask nitride film 205 is deposited over the gate electrode 204. The hard mask oxide film 206 is etched with the gate hard mask nitride film 205 as a mask to form a gate electrode pattern. The method for forming the gate pattern of the saddle-type fin transistor has been well-known to a person having an ordinary skill in the art.

Referring to FIG. 2b, impurities are ion-implanted into the surface of the semiconductor substrate 201 through the exposed gate oxide film 203 to form a cell lightly doped drain (LDD) region. The LDD region doped with low impurities (N-) improves an operating voltage of the transistor. A cell spacer nitride film 207 is deposited over the gate oxide film 203 and the gate pattern having the LDD region. A first interlayer insulating film 208 for separating unit cells is formed over the cell spacer nitride film 207 between the gate patterns. A chemical-mechanical polishing (CMP) process is performed on the first interlayer insulating film 208 to expose the cell spacer nitride film 207. A plug hard mask film 209 is deposited over the exposed cell spacer nitride film 207 and the first interlayer insulating film 208.

After the plug hard mask film 209 is deposited, as shown in FIG. 2c, a first photoresist film 210 is formed and patterned with the plug mask shown in FIG. 1e. The plug hard mask film 209 is etched with the first photoresist film 210, and the first interlayer insulating film is removed. The cell spacer nitride film 207 is blanket-etched until the gate hard mask nitride film 205 is exposed, so that the cell spacer nitride film 207 remains only on the sidewalls of the gate pattern. The gate oxide film 203 exposed between the gate patterns is etched.

As shown in FIG. 2d, the first photoresist film 210 is removed. A polysilicon (poly Si) film 211 used as a plug is deposited over a space obtained from the etching process. A CMP process is performed on the polysilicon film 211 to expose the gate hard mask nitride film 205.

As shown in FIG. 2e, a second interlayer insulating film 212 is deposited with a given thickness over the resulting structure. A bit line contact hard mask film 213 is deposited over the second interlayer insulating film 212. A second photoresist film 214 is coated over the bit line contact hard mask film 213 and patterned with the bit line contact mask shown in FIG. 1f. The second interlayer insulating film 212 is etched with the second photoresist film 214.

As shown in FIG. 2f, the second photoresist film 214 and the bit line contact hard mask film 213 are removed to form a bit line barrier metal film 215 with a given thickness. A Rapid Thermal Annealing (RTA) process is performed on the bit line barrier metal film 215. A bit line material is deposited over the bit line barrier metal film 215 to form a bit line 216. A bit line hard mask nitride film 217 is formed over the bit line 216.

Referring to FIG. 2g, a third photoresist film (not shown) is coated over the bit line hard mask nitride film 217 and patterned with the bit line mask shown in FIG. 1f. The bit line hard mask nitride film 217, the bit line 216 and the bit line barrier metal film 215 are sequentially etched with the third photoresist film.

The bit line barrier metal film 215 is etched to form a bit line pattern. As shown in FIG. 2h, a bit line nitride film 218 is formed on sidewalls of the bit line pattern. A third interlayer insulating film 219 is deposited between the bit line patterns. A CMP process is performed on the third interlayer insulating film 219 to expose the bit line hard mask nitride film 217.

A storage node (SN) contact in the unit cell is formed over the active region where the bit line 216 is not formed. A capacitor and a line including a metal layer are formed over the SN contact to obtain a cell array in the semiconductor memory apparatus.

As the integration of the semiconductor memory apparatus is required to be higher, it is difficult to secure the minimum separation distance in order to prevent mis-operations of the lines and devices of the semiconductor memory apparatus. Also, the layout of devices and lines is complicated to increase the integration. Although masks with various patterns are required to obtain the layout, it is difficult to fabricate the masks with various patterns due to decrease of the design rule. In order to overcome the limitations and difficulties of the process, the ISO mask of FIG. 1b is moved toward the Y-axis direction according to a specific design to obtain the plug mask of FIG. 1e in the above described method for manufacturing a cell array of a semiconductor memory apparatus.

However, while the polysilicon film 211 is deposited over the space etched with the plug mask shown in FIG. 1e, polysilicon is over-deposited corresponding to a region 'F' shown in FIG. 2e. Referring to FIG. 1a, the over-deposited polysilicon film 211 is separated from the gate pattern by the gate nitride film 207 formed on the sidewalls of the gate pattern, which increases parasite capacitance between the gate pattern (that is, word line) and the bit line 216. As a result, it is difficult to sense data transmitted to the bit line 216 through the cell transistor. That is, the parasite capacitance reduces the data sensing margin of the bit line 216.

Furthermore, in the conventional method, the space for the bit line contact is formed in FIG. 2e, and the bit line is formed in FIG. 2g. The process may cause mis-alignment between the bit line contact mask and the bit line mask shown in FIG. 1f to reduce a process margin. In order to reduce defects generated in the manufacturing process of the semiconductor memory apparatus, methods for reducing the size of the bit line contact or increasing the thickness of the bit line sidewall nitride film corresponding to the mis-alignment are used to overcome the process margin. However, the reduction in the size of the bit line contact increases a bit line contact resistance of the cell transistor, and the increase in the thickness of the bit line sidewall nitride film corresponding to the mis-alignment increases a SN contact resistance. These two methods reduce an operating current of the cell transistor included in each unit cell, so that the speed of read and write operations of the semiconductor memory apparatus becomes slower. The excessive increase of the resistance may cause mis-operation.

BRIEF SUMMARY OF THE INVENTION

Various embodiments of the present invention are directed at providing a method of manufacturing a semiconductor memory apparatus that includes a cell array to reduce parasite capacitance generated between a bit line and a gate pattern by a mask pattern simplified due to reduction of a design rule.

According to an embodiment of the present invention, a method for manufacturing a semiconductor memory apparatus may include determining a plug region by a storage-node plug contact mask and a bit line plug mask.

The method further may include: forming a gate pattern of a cell transistor and depositing an insulation layer over a structure including the gate pattern; and forming a hard mask layer over the insulation layer.

Determining a plug region may include: etching the hard mask layer through a photo lithography with the storage-node plug contact mask; etching the hard mask layer through a photo lithography with the bit line plug mask; and etching the insulation layer by using an etched hard mask layer.

The method further may include forming a conductive layer in the plug region.

Regions may be respectively exposed by each of the storage-node plug contact mask and the bit line plug mask are not overlapped.

An upper part over the active region of the cell transistor may be exposed by the storage-node plug contact mask.

Regions respectively exposed by each of the storage-node plug contact mask and the bit line plug mask may be partially overlapped, and the region exposed by the storage-node plug contact mask may be diametrically opposed to region exposed by an ISO mask determining the active region of cell transistor.

The method further may include forming the bit line and a bit line contact simultaneously by depositing a conductive material in both a first region for the bit line contact and a second region for the bit line, wherein the first region is formed over the plug contact.

One side of the first region may be aligned with that of the plug contact.

Forming the bit line and a bit line contact simultaneously may include: making the second region through a first etching process with a bit line mask; making the first region in the second region through a second etching process with a bit line contact mask; forming a barrier metal layer over a bottom and sidewalls of the first and second regions; filling up the conductive material into the first and second regions; and etching back the conductive material until the conductive material remains with a predetermined thickness.

The first and the second regions are formed through a self-aligned etching process after a plurality of bit line hard mask layers are formed.

Forming the bit line and a bit line contact simultaneously further may include: performing a wet-etching process to enlarge a room which results from the etch-back process over the conductive material; and forming a bit line hard mask nitride layer in the room, thereby guarding the bit line.

According to another embodiment of the present invention, a method for manufacturing a semiconductor memory apparatus may include: depositing a conductive layer in a region etched by using a storage-node plug contact mask and a bit line plug mask to form a plug; and forming the bit line and a bit line contact simultaneously by depositing a conductive material in a region which results from etching a hard mask layer formed over the plug by using a bit line contact mask and a bit line mask.

Forming a plug may include: etching the hard mask layer through a photo lithography with the storage-node plug contact mask; etching the hard mask layer through a photo lithography with the bit line plug mask; etching the insulation layer by using an etched hard mask layer; and depositing the conductive layer into the region.

One side of the plug contact is aligned with that of a region etched with the bit line contact mask.

Forming the bit line and a bit line contact simultaneously may include: etching the hard mask layer by using the bit line mask and the bit line contact mask subsequently; filling up the conductive material into a region formed through the etching the hard mask layer; and etching back the conductive material until the conductive material remains with a predetermined thickness.

According to another embodiment of the present invention, a semiconductor memory apparatus may include: a bit line contact for coupling a bit line to a cell transistor; a plug for enlarging an active region of the cell transistor to be connected to the bit line contact; and a bit line upper insulation layer having a larger size than the bit line. One side of the bit line, the bit line contact, and the plug is aligned.

The bit line and the bit line contact may be constituted with a single conductive layer.

Sidewalls of the bit line may be surrounded by an oxide layer.

Bottoms and sidewalls of the bit line and the bit line contact may be surrounded by a single barrier metal layer.

BRIEF DESCRIPTION OF THE DRAWINGS

FIGS. 5a to 5m are cross-sectional diagrams illustrating a method of manufacturing a semiconductor memory apparatus using the mask pattern shown in FIGS. 4a to 4f.

DESCRIPTION OF EMBODIMENTS

Figure 3:
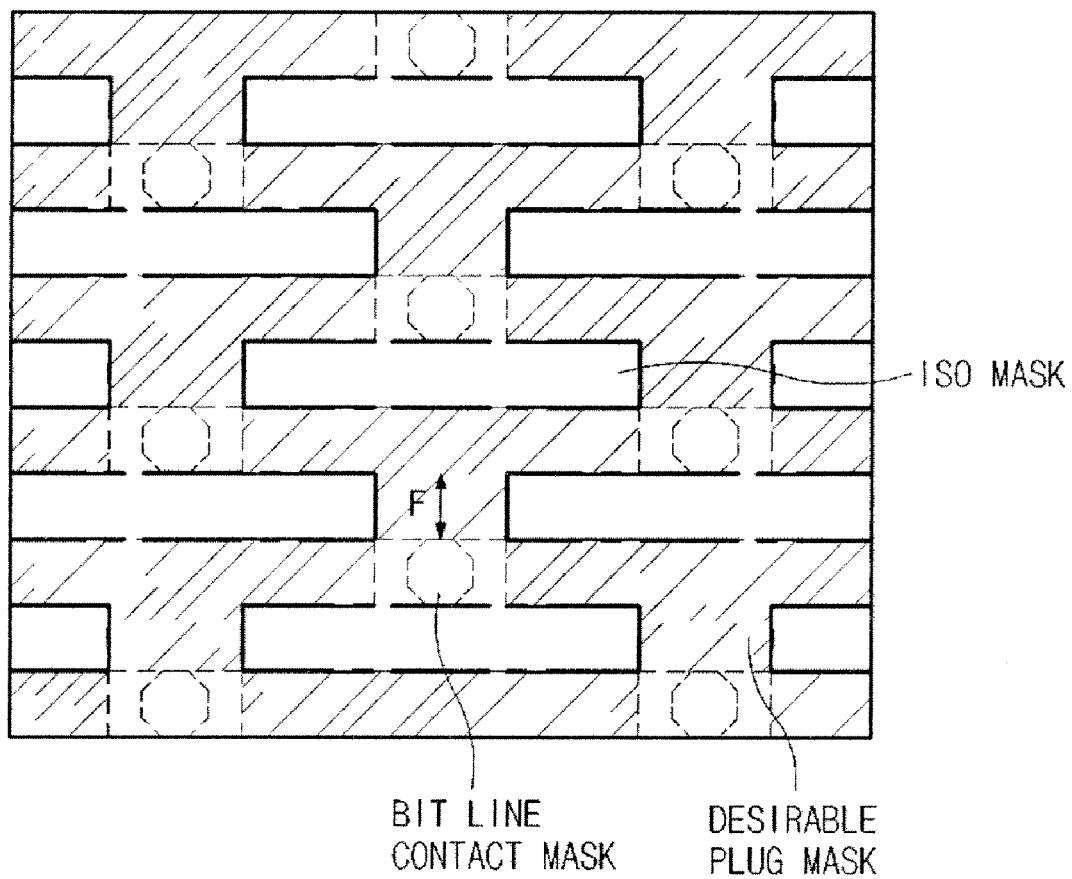
FIG. 3 is a plane diagram illustrating a mask pattern for manufacturing a cell array in accordance with one or more embodiment of the present invention.

FIG. 3 is a plane diagram illustrating a mask pattern for manufacturing a cell array that may overcome problems of the conventional art.

Figure 1A:
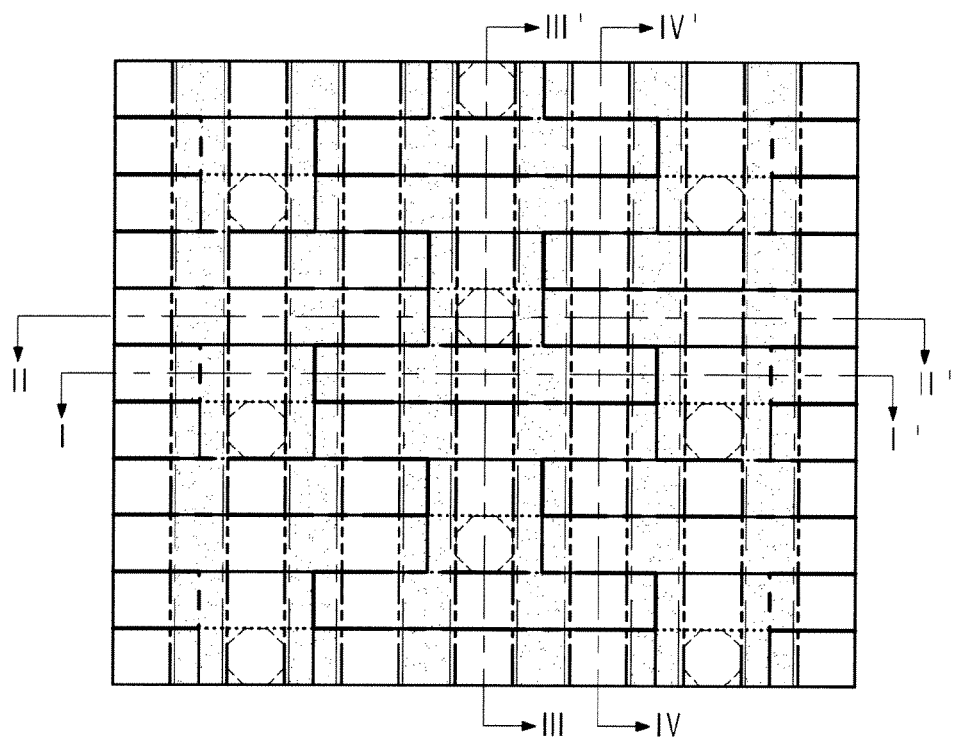
FIGS. 1a to 1f are plane diagrams illustrating a mask pattern for forming a cell array included in a general semiconductor memory apparatus.
Figure 1B:
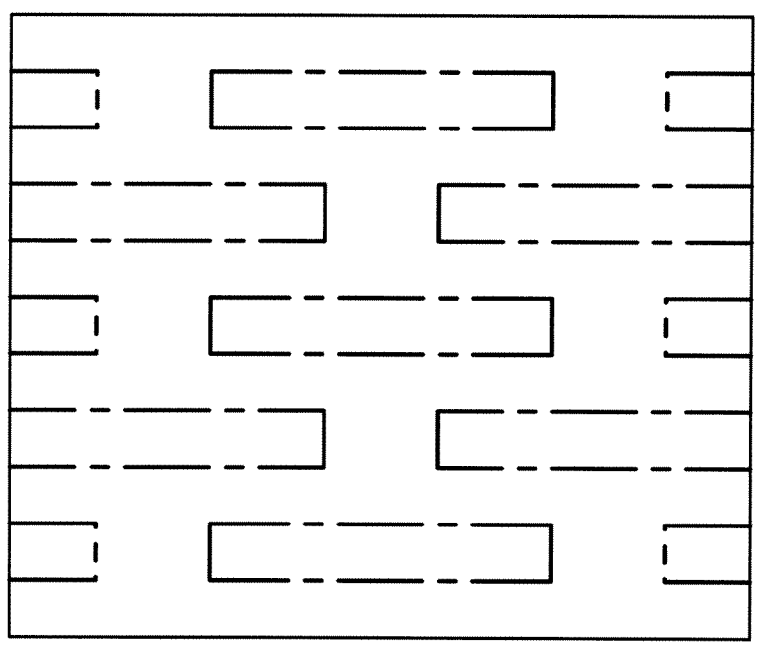
Figure 1C:
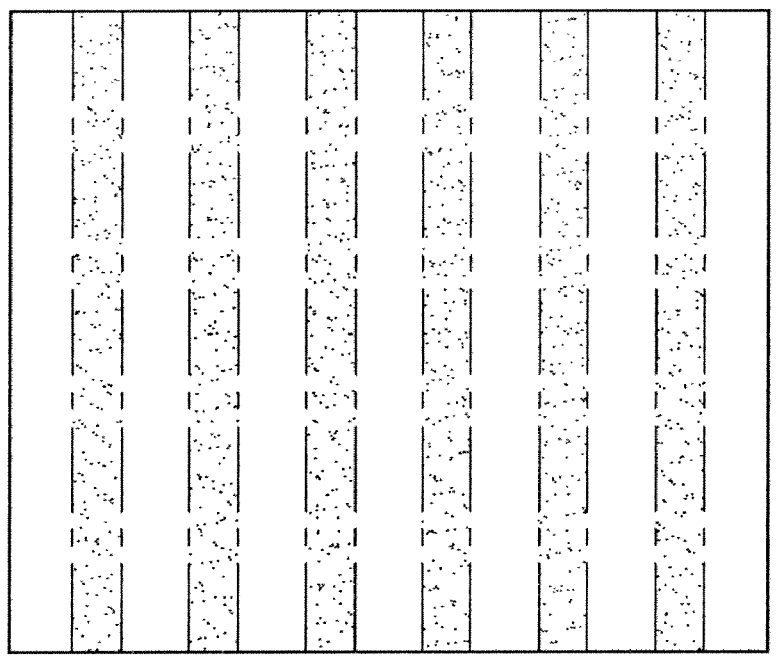
Figure 1D:
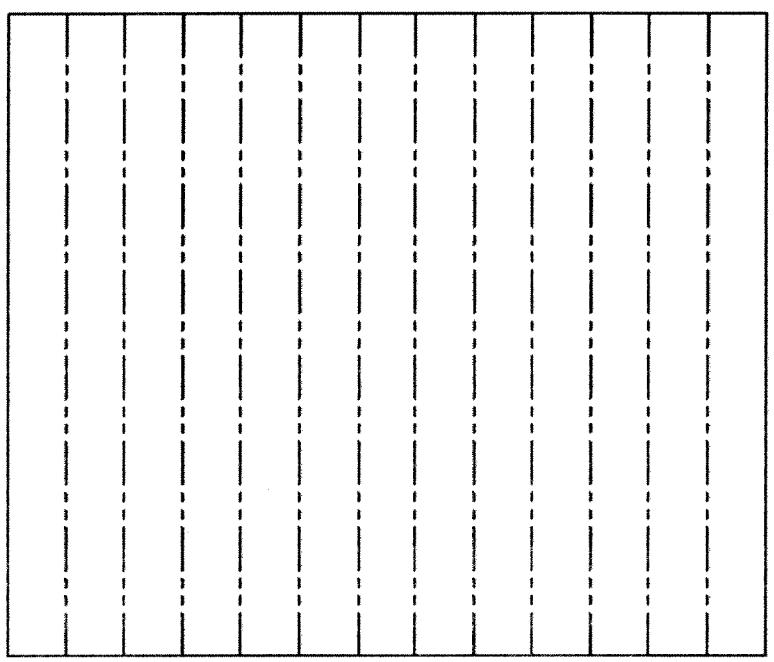
Figure 1E:
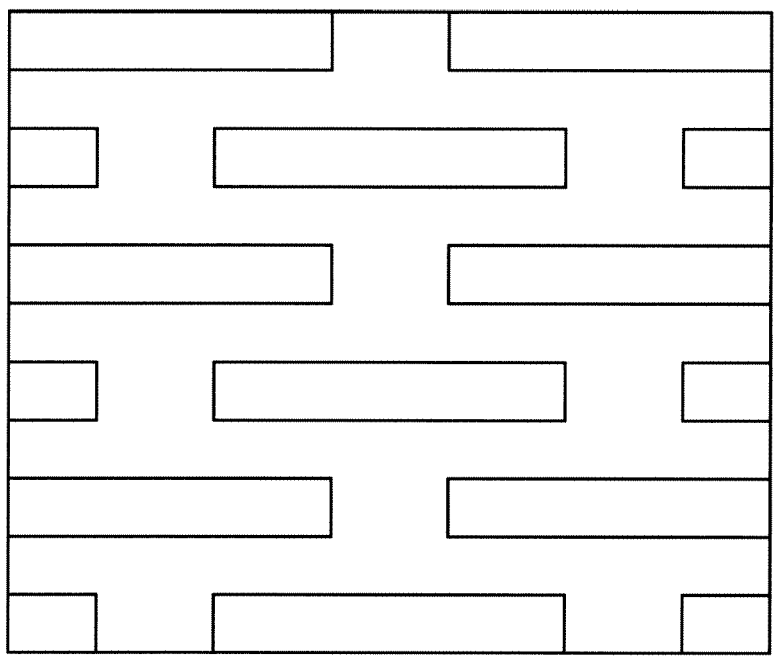
Figure 1F:
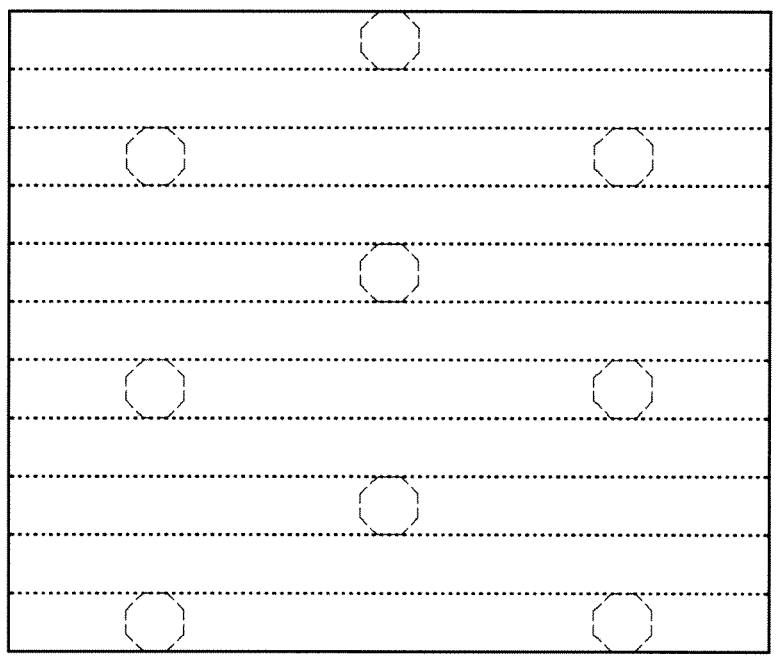
Figure 2A:
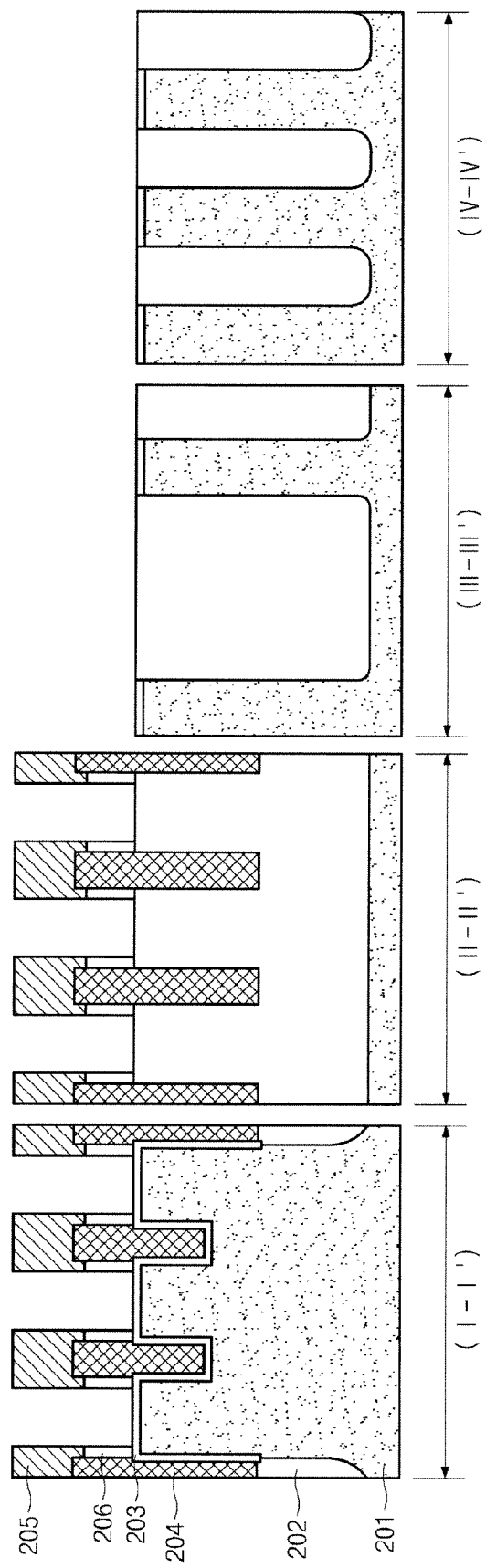
FIGS. 2a to 2h are cross-sectional diagrams illustrating a method for forming a cell array in the semiconductor memory apparatus using a plurality of masks shown in FIGS. 1a to 1f.
Figure 2B:
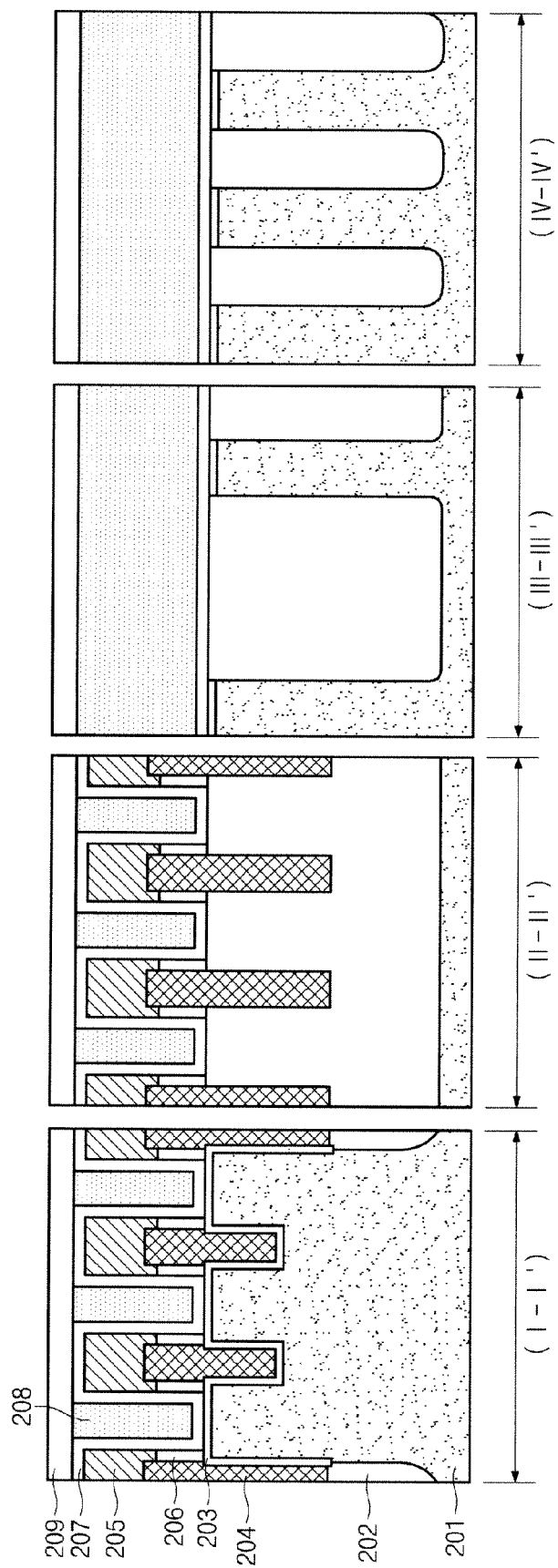
Figure 2C:
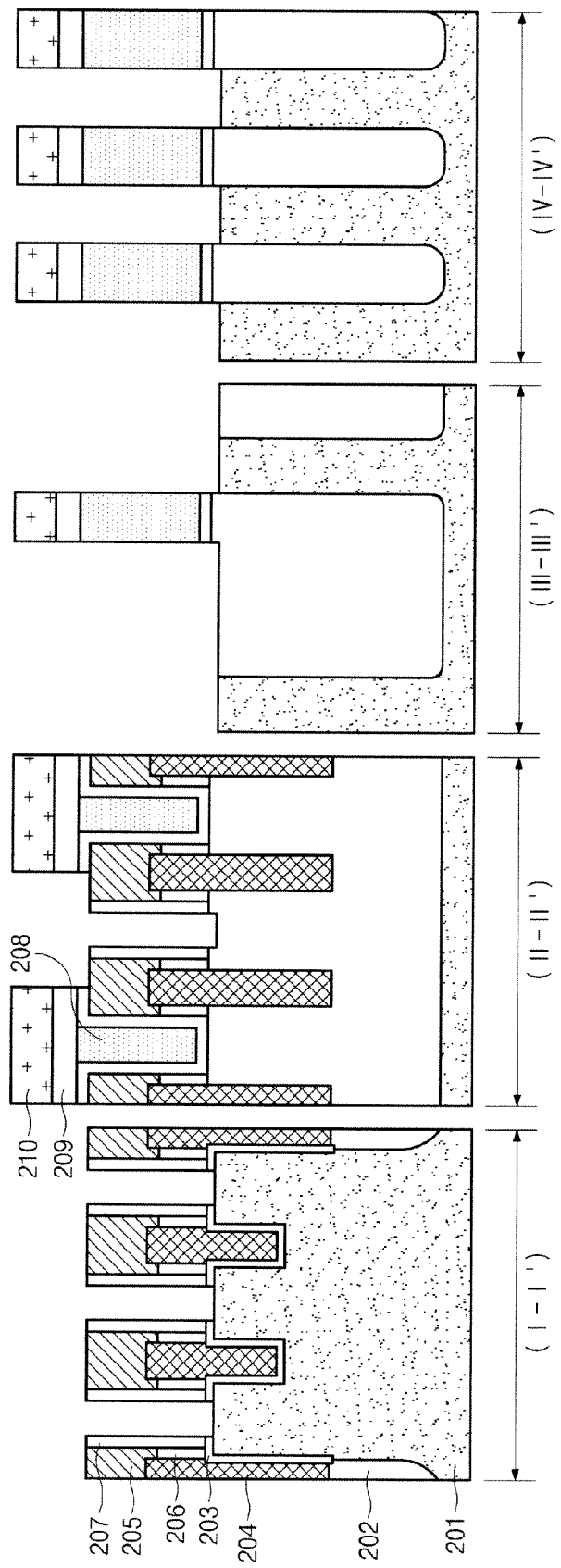
Figure 2D:
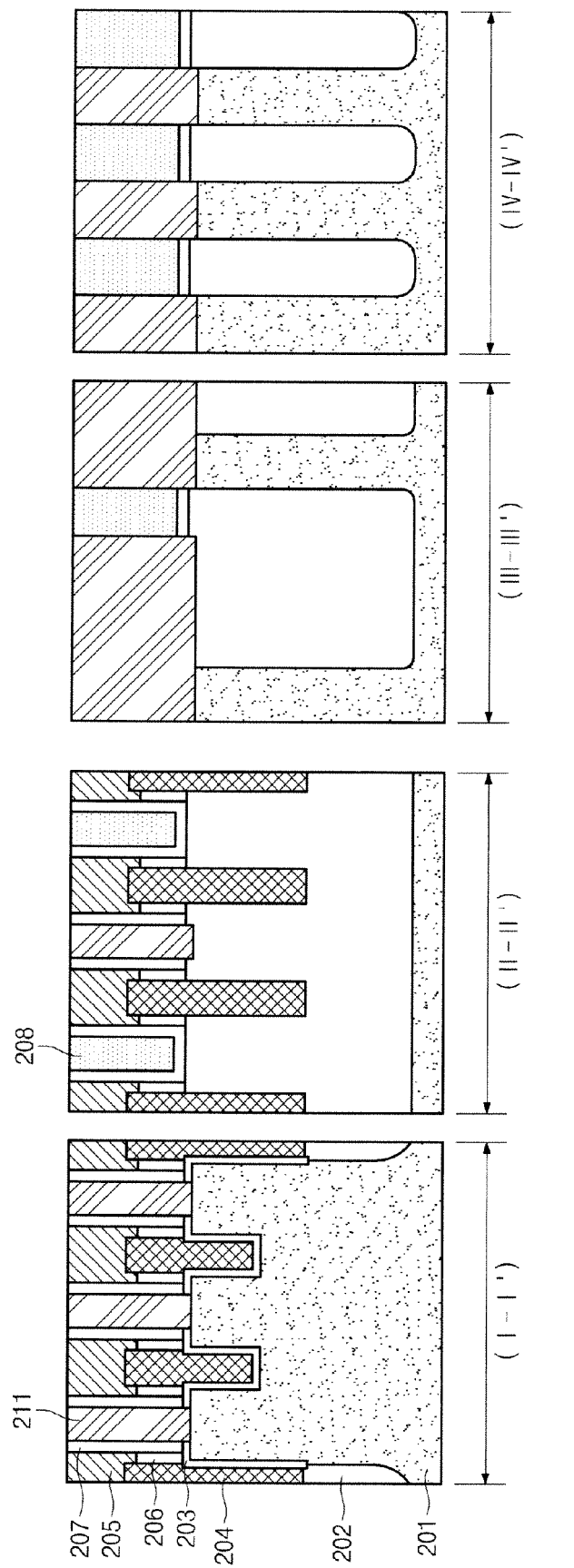
Figure 2E:
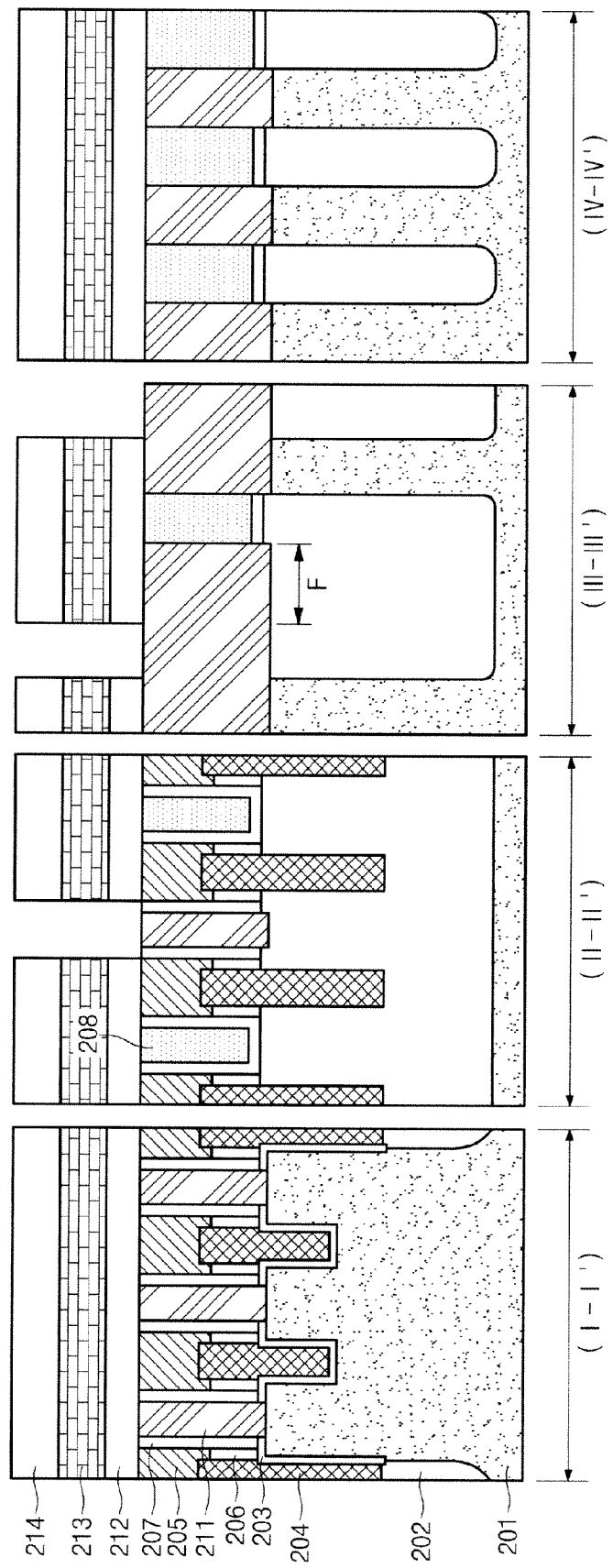
Figure 2F:
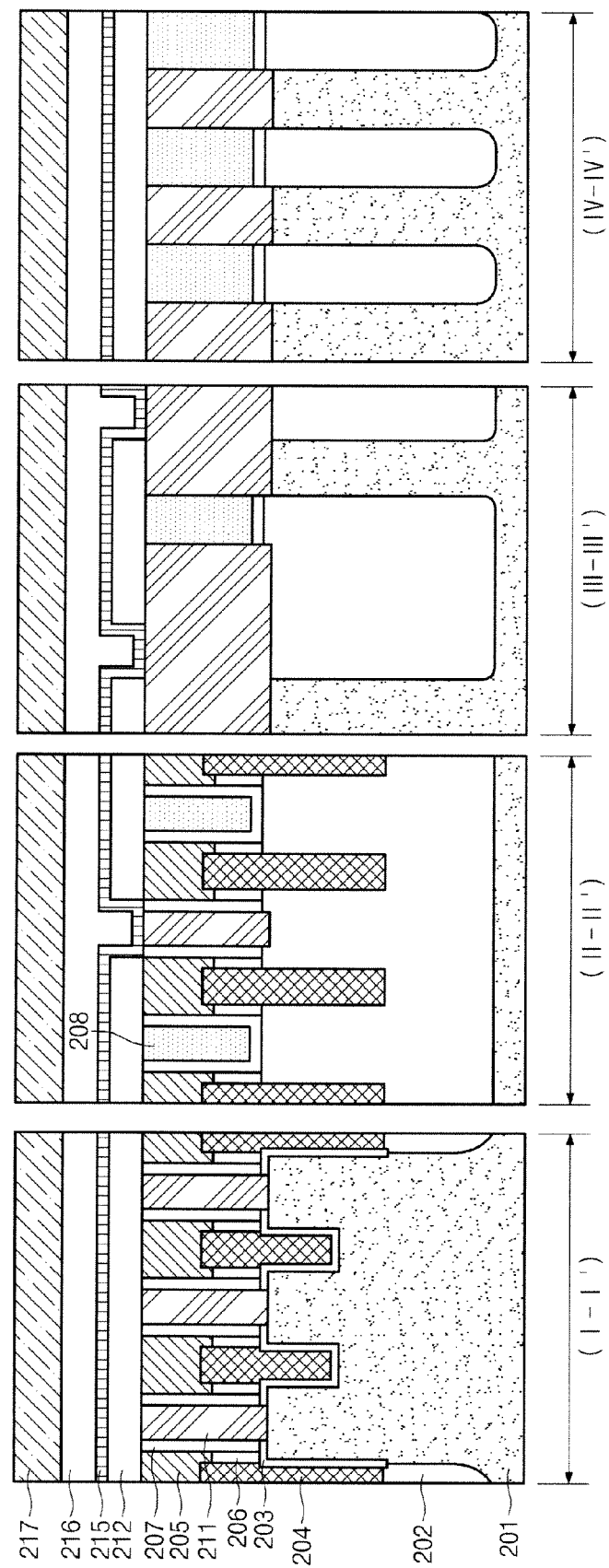

Referring to FIG. 3, a desirable plug mask for preventing the increase of parasite capacitance of a bit line due to the polysilicon film formed in an unnecessary region shown in FIG. 2e is different from the plug mask of FIG. 1e. Particularly, the shape and position of the desirable plug mask are distinguishable from those of the ISO mask of FIG. 1b and the bit line contact mask of FIG. 1f.

The region in which the polysilicon film is over-deposited in FIG. 2e is generated because the region 'F' cannot be protected with the plug mask of FIG. 1e but the first interlayer insulating film 208 exposed corresponding to the region 'F' is removed in the etching process of FIG. 2c. On the other hand, the shape of the desirable plug mask of FIG. 3 can protect the region 'F' in the etching process of the first interlayer insulating film 208. However, due to decrease in the design rule and increase in the integration of the semiconductor memory apparatus, there is a technical limit in formation of complicated and fine masks like the desirable plug mask shown in FIG. 3.

In accordance with embodiments of the invention, a method is provided for forming a mask that has the same effect as that of the desirable plug mask of FIG. 3. In one potential embodiment of the present invention, a saddle-type fin transistor having a unit cell area of 8F*F as a cell transistor is exemplified. However, the embodiments of the present invention are not limited to the form of the cell transistor included in a unit cell, but may have application to methods of forming a plug, a bit line contact and/or a bit line when the cell transistor has virtually any suitable shape. The plug and the bit line contact are for connecting a bit line to an active region disposed at one side of the cell transistor. The plug contacts with the active region of the cell transistor to be expanded for connection with the bit line contact. The bit line contact is for connecting the bit line to the plug.

FIGS. 4a to 4f are plane diagrams illustrating a mask pattern for manufacturing a semiconductor memory apparatus according to an embodiment of the present invention.

Figure 4A:
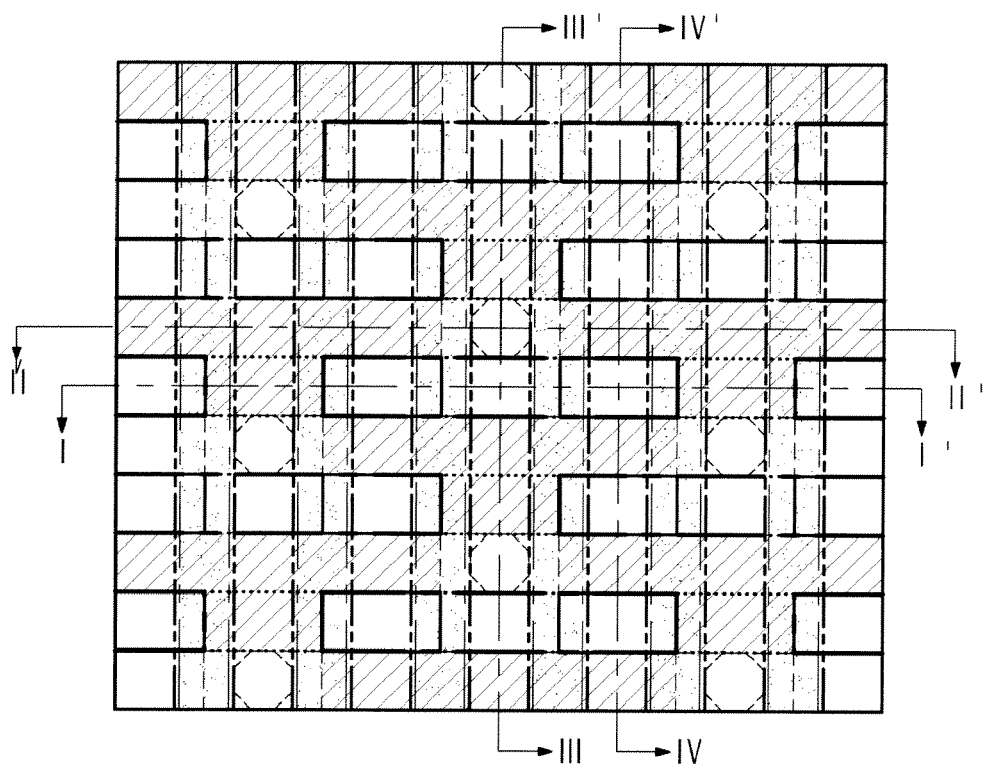
FIGS. 4a to 4f are plane diagrams illustrating a mask pattern for manufacturing a semiconductor memory apparatus according to one or more embodiments of the present invention.
Figure 4B:
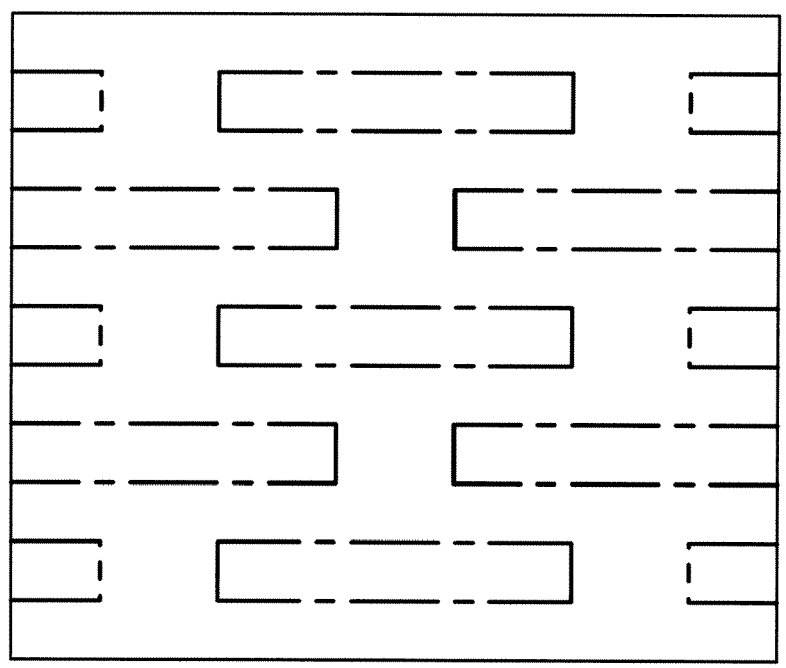
Figure 4C:
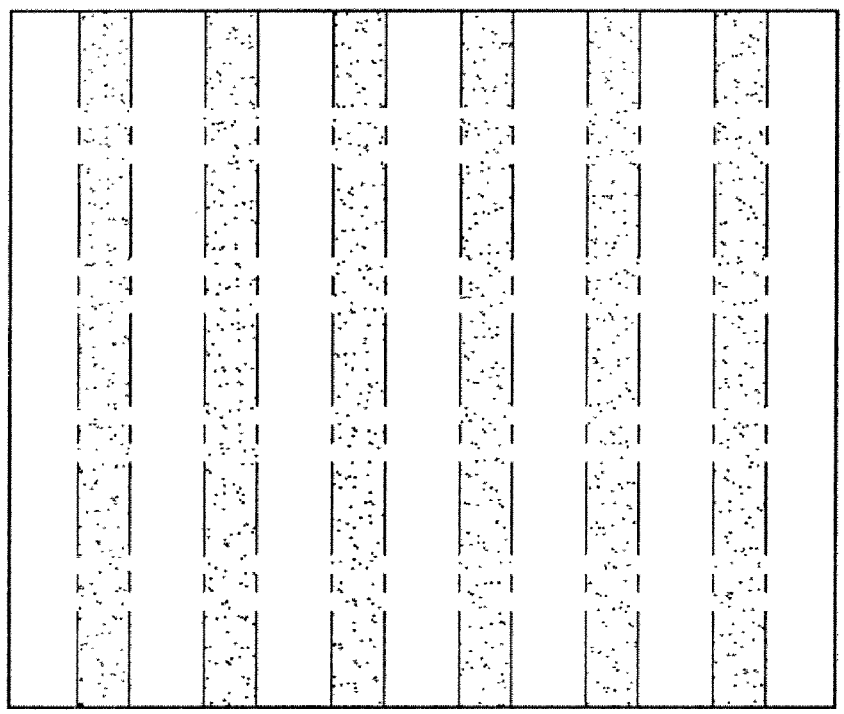
Figure 4D:
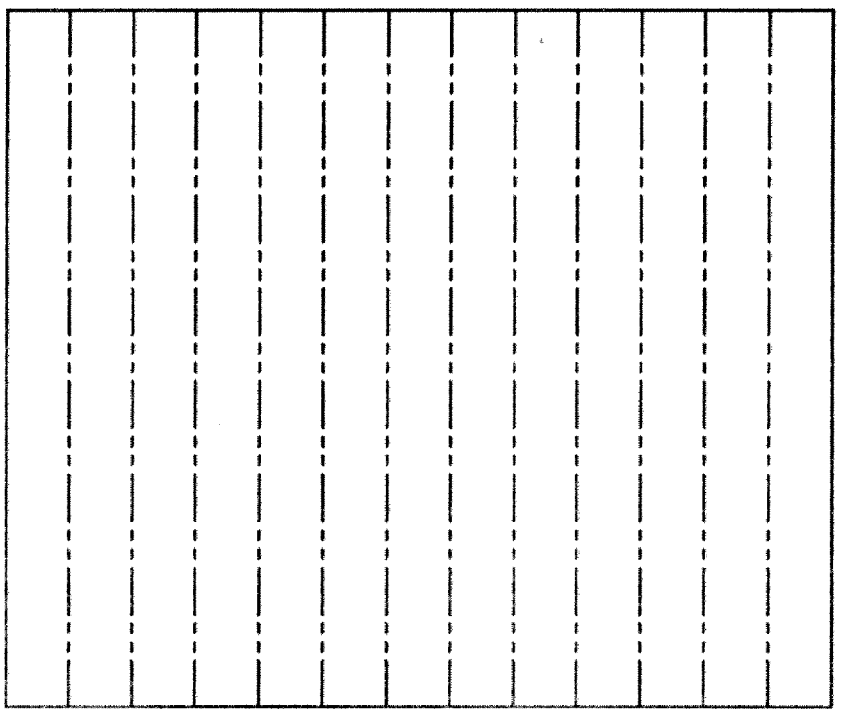

FIG. 4a shows when various masks used in formation of a cell array are overlapped. Specifically, the masks include an ISO mask (see FIG. 4b) for defining an active region, a gate mask (see FIG. 4d) for defining a gate region of a cell transistor, a fin mask (see FIG. 4c) for defining a lower gate fin region of a saddle-type fin transistor, a SN plug mask (represented by solid lines in FIG. 4e) and a bit line plug mask (represented by dotted lines in FIG. 4e) used as plug masks, respectively, for defining a region in which a plug contact is formed, a bit line contact mask (represented by polygonal shapes in FIG. 4f) for defining a region where a bit line contact is formed, and a bit line mask (see FIG. 4f) for defining a bit line region.

Referring to FIG. 4a, the ISO masks are arranged in a cross-section (I-I') of a first X-axis. The plug masks shown in FIG. 4e, the bit line contact masks, and the bit line masks shown in FIG. 4f are arranged in a cross-section (II-II') of a second X-axis. The bit line contact masks and the bit line plug masks shown in FIG. 4f are arranged in a cross-section (III-III') of a first Y-axis. The ISO masks and the SN plug masks are arranged in a cross-section (IV-IV') of a second Y axis.

While the ISO mask is moved toward the Y-axis by the design rule ('F'), not to transmit light in the plug mask shown in FIG. 1e according to the conventional art, the two masks (that is, the SN plug mask and the bit line plug mask) define a region in which light can be transmitted. When the two masks are used, the shape in which light cannot be transmitted is substantially similar to that of the desirable plug mask of FIG. 3.

FIGS. 5a to 5m are cross-sectional diagrams illustrating a method of manufacturing a semiconductor memory apparatus using the mask pattern shown in FIGS. 4a to 4f.

Figure 5A:
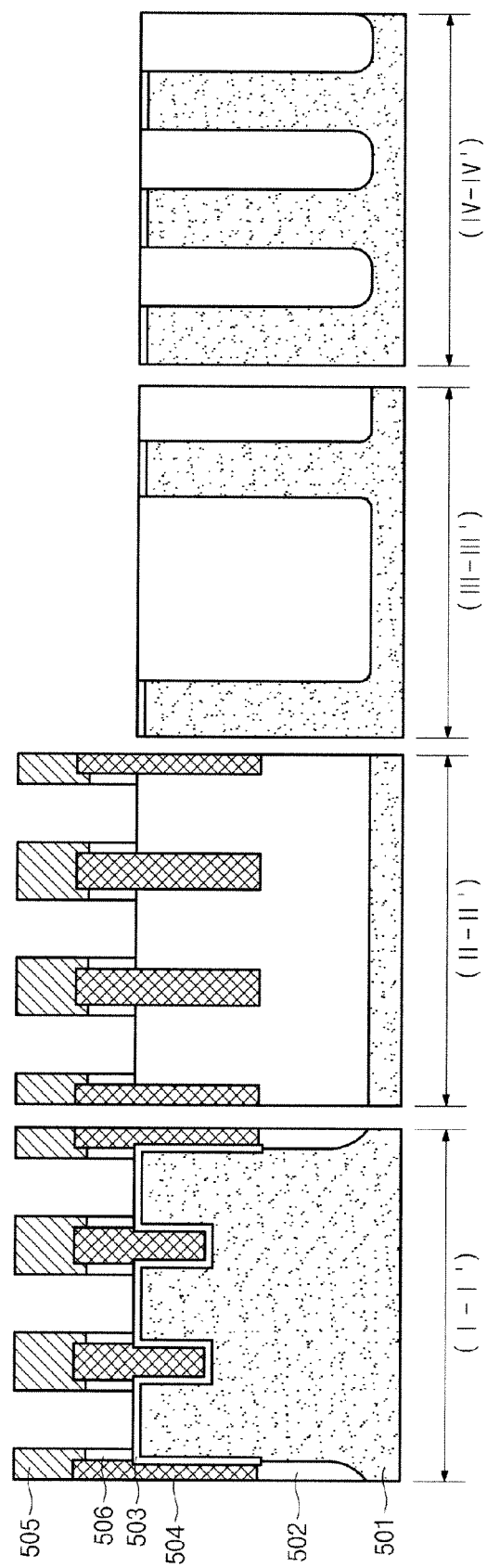

Referring to FIG. 5a, a Shallow Trench Isolation (STI) process is performed to form a device isolation film 502 in a semiconductor substrate 501. The exposed semiconductor substrate 501 and the device isolation film 502 are etched with the fin mask shown in FIG. 4c to form a fin region of the saddle-type fin transistor. A gate oxide film 503 is formed over the fin region, and the gate electrode 504 is deposited and planarized. A gate hard mask nitride film 505 is deposited over the gate electrode 504.

A photoresist film is coated over the gate hard mask nitride film 505. The gate hard mask nitride film 505 is etched with the gate mask shown in FIG. 4d. A hard mask oxide film 506 is etched with the gate hard mask nitride film 505 as a mask to form a gate electrode pattern. Suitable methods of forming a gate pattern of the saddle-type fin transistor are well-known to a person having an ordinary skill in the art.

Figure 5B:
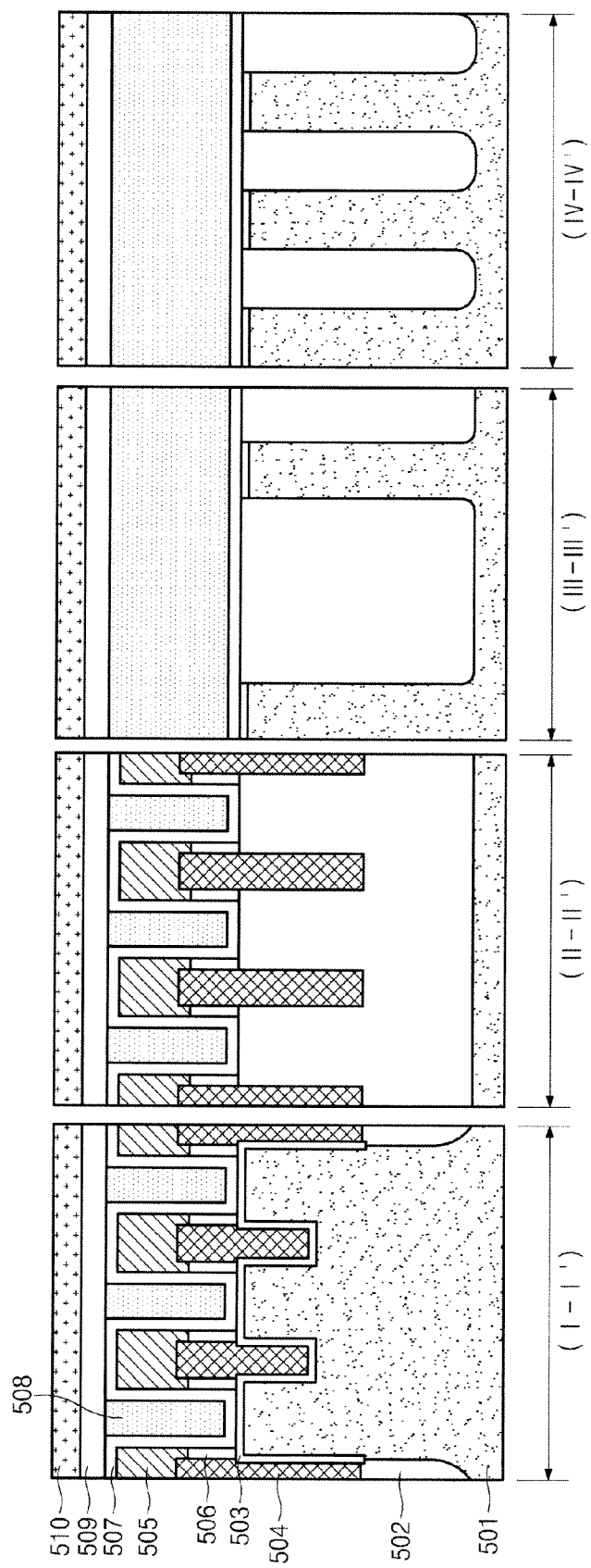

Referring to FIG. 5b, impurities are ion-implanted into the surface of the semiconductor substrate 501 through the gate oxide film 503 to form a cell lightly doped drain (LDD) region. The LDD region doped with low impurities (N-) improves an operating voltage of the transistor. A cell spacer nitride film 507 is deposited over the gate oxide film 503 and the gate pattern having the LDD region. A first interlayer insulating film 508 for separating the cell spacer nitride films 507 is formed between the gate patterns. A chemical mechanical polishing (CMP) or other suitable process may be performed on the first interlayer insulating film 508 to expose the cell spacer nitride film 507. A plug hard mask film 509 and a second plug hard mask film 510 are deposited over the planarized cell spacer nitride film 507 and the first interlayer insulating film 508.

Figure 4E:
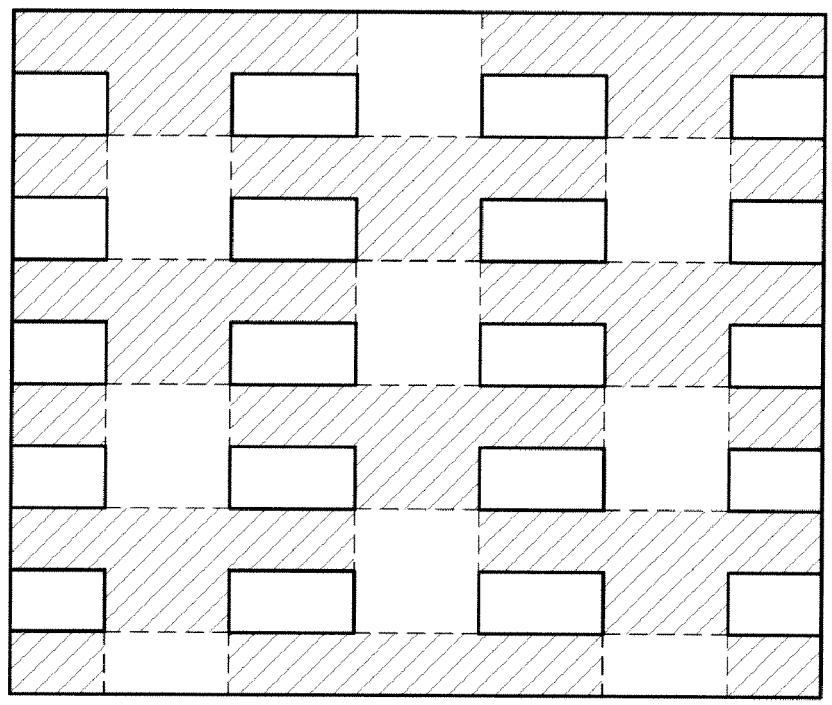
Figure 4F:
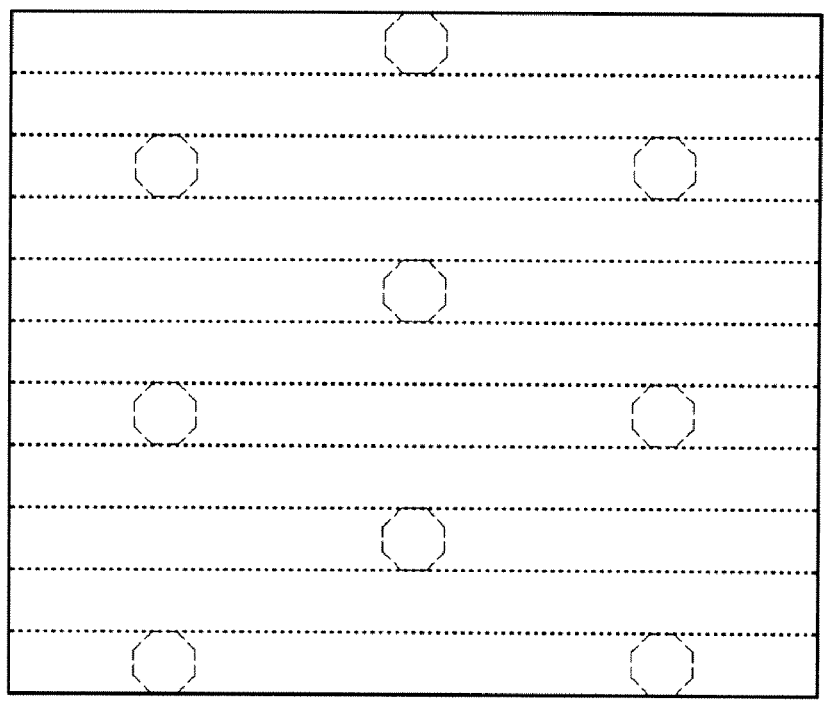
Figure 5C:
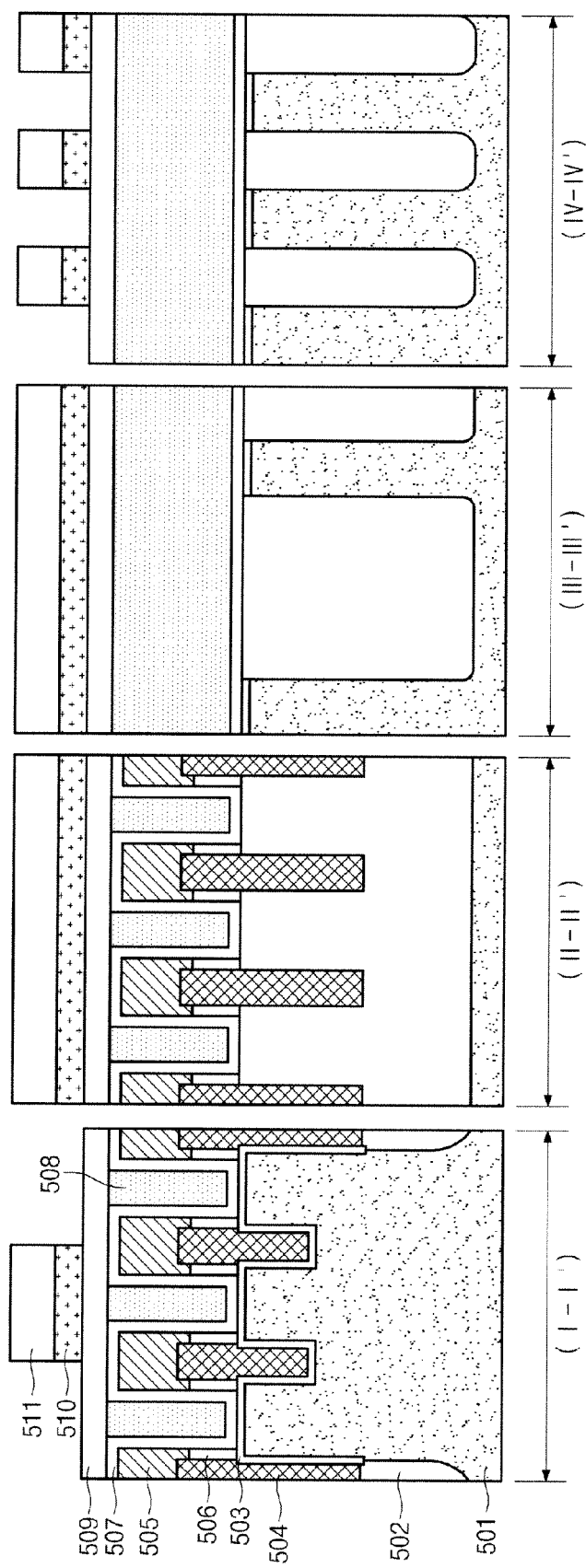

After the second plug hard mask film 510 is deposited, as shown in FIG. 5c, a first photoresist film 511 is formed and patterned with the SN node plug mask shown in FIG. 4e. The second plug hard mask film 510 is etched with the first photoresist film 511.

Figure 5D:
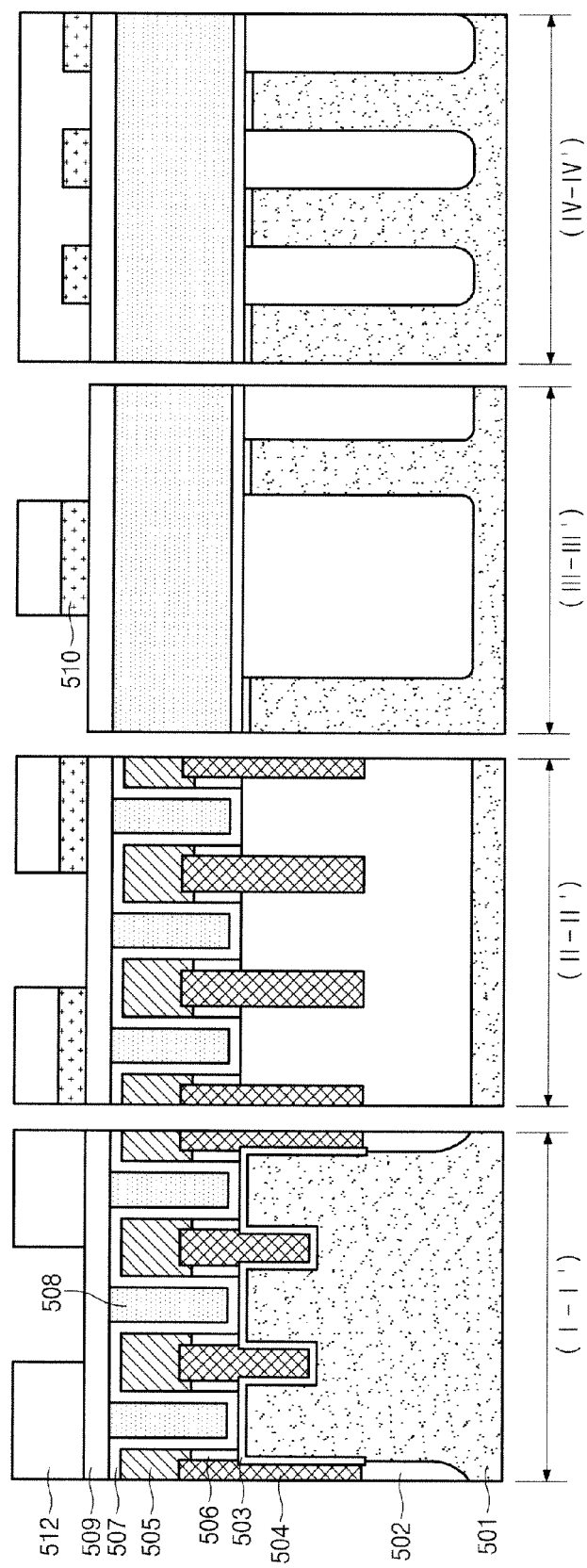

The first photoresist film 511 is removed. As shown in FIG. 5d, a second photoresist film 512 is formed and patterned with the bit line plug mask shown FIG. 4e. The second plug hard mask film 510 is etched with the second photoresist film 512.

Figure 5E:
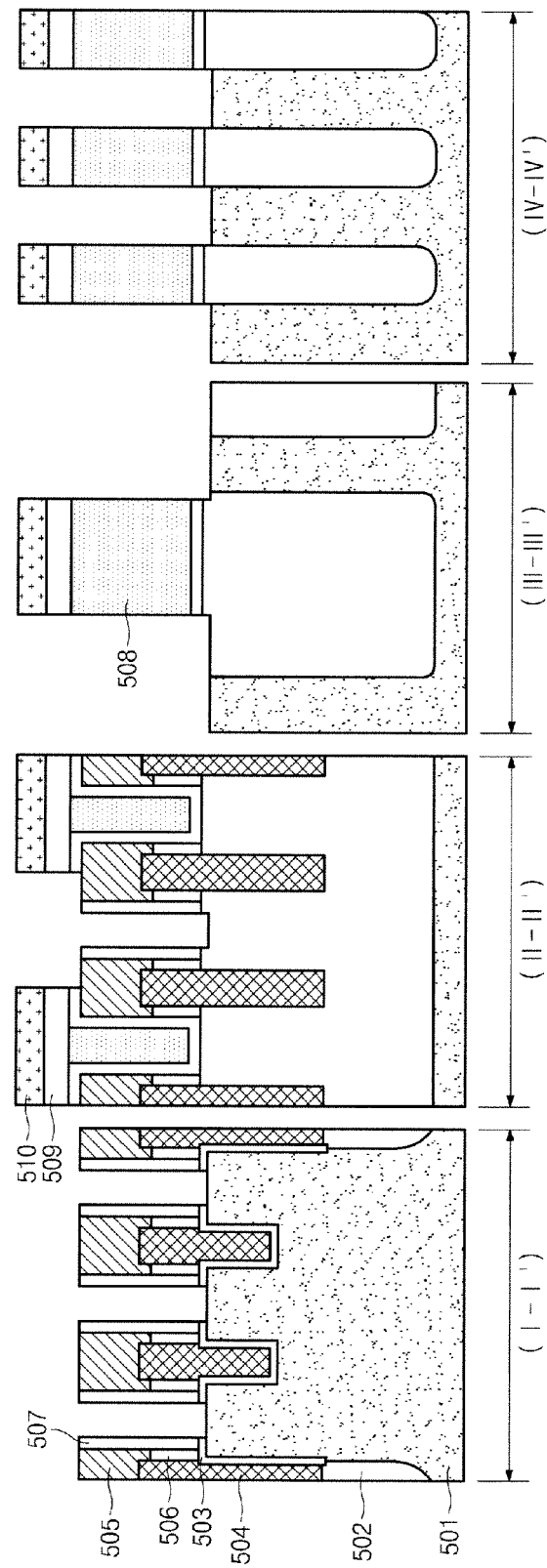

Referring to FIG. 5e, the second photoresist film 512 is removed. The first plug hard mask film 509 is etched with the second plug hard mask film 510 patterned through the twice etching process. The first plug hard mask film 509 is etched, and the first interlayer insulating film 508 is selectively etched. The exposed cell spacer nitride film 507 may be dry-etched to expose the gate hard mask nitride film 505, so that the cell spacer nitride film 507 may remain on sidewalls of the gate pattern. The gate oxide film 503 exposed between the gate patterns is etched.

Figure 5F:
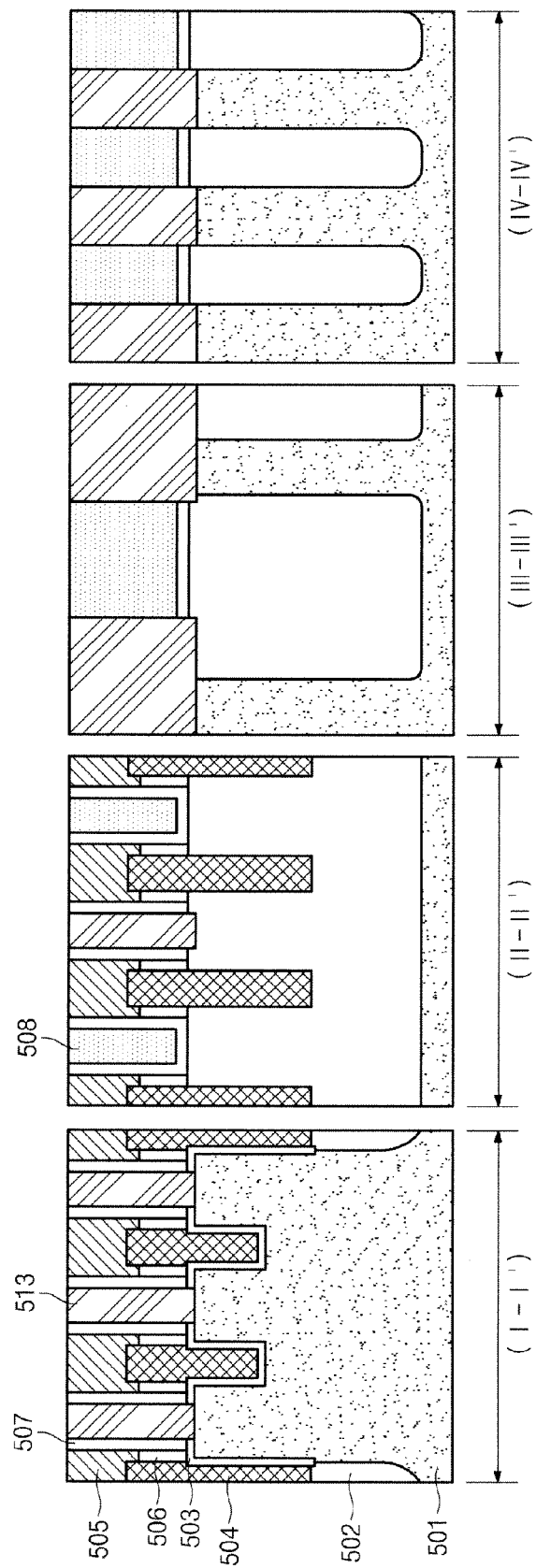

As shown in FIG. 5f, a polysilicon film 513, which is a conductive material used as a plug, may be deposited over a space generated from the etching process. A CMP process or other suitable process may be performed on the polysilicon film 513 to expose the gate hard mask nitride film 505.

Figure 5G:
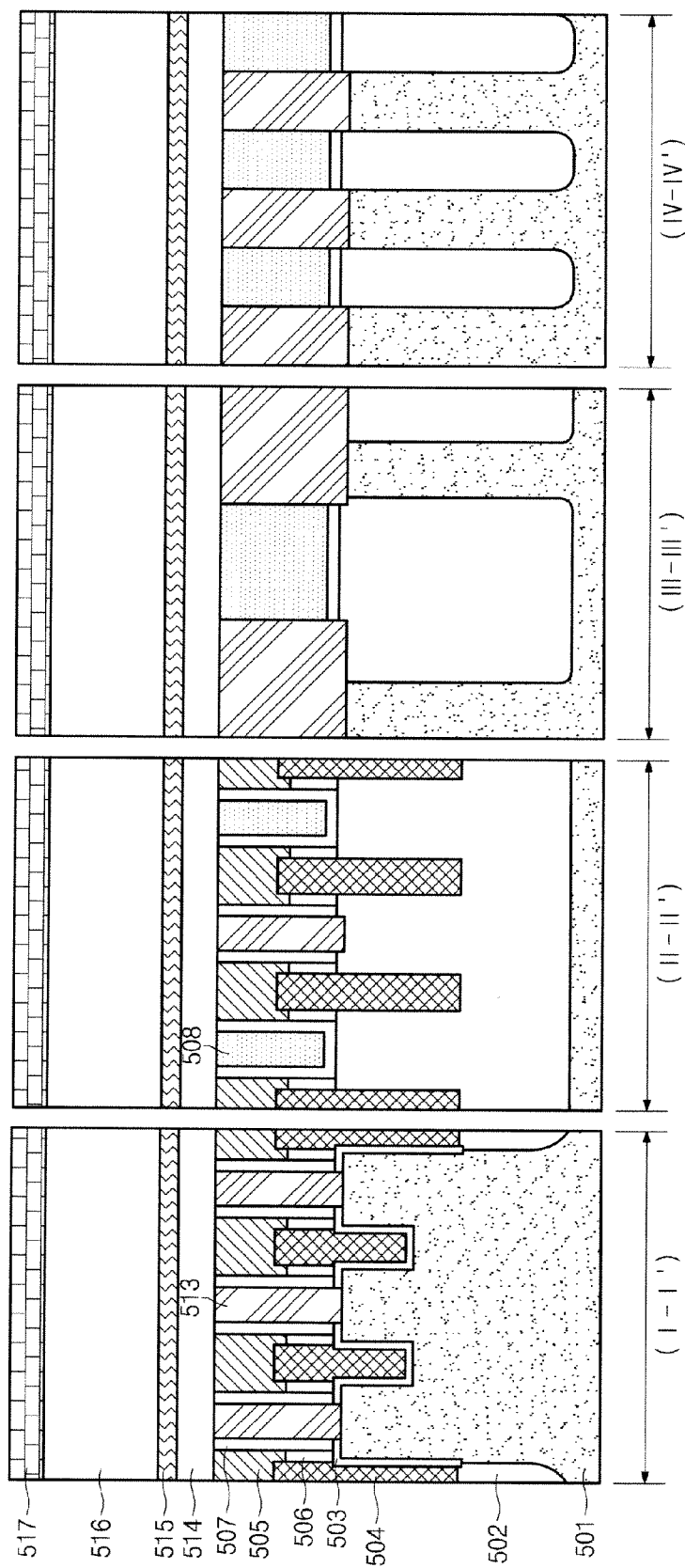

After a second interlayer insulating film 514 is deposited with a given thickness over the resulting structure, as shown in FIG. 5g, a first bit line hard mask film 515, a second bit line hard mask film 516 and a third bit line hard mask film 517 are sequentially deposited over the second interlayer insulating film 514.

Figure 5H:
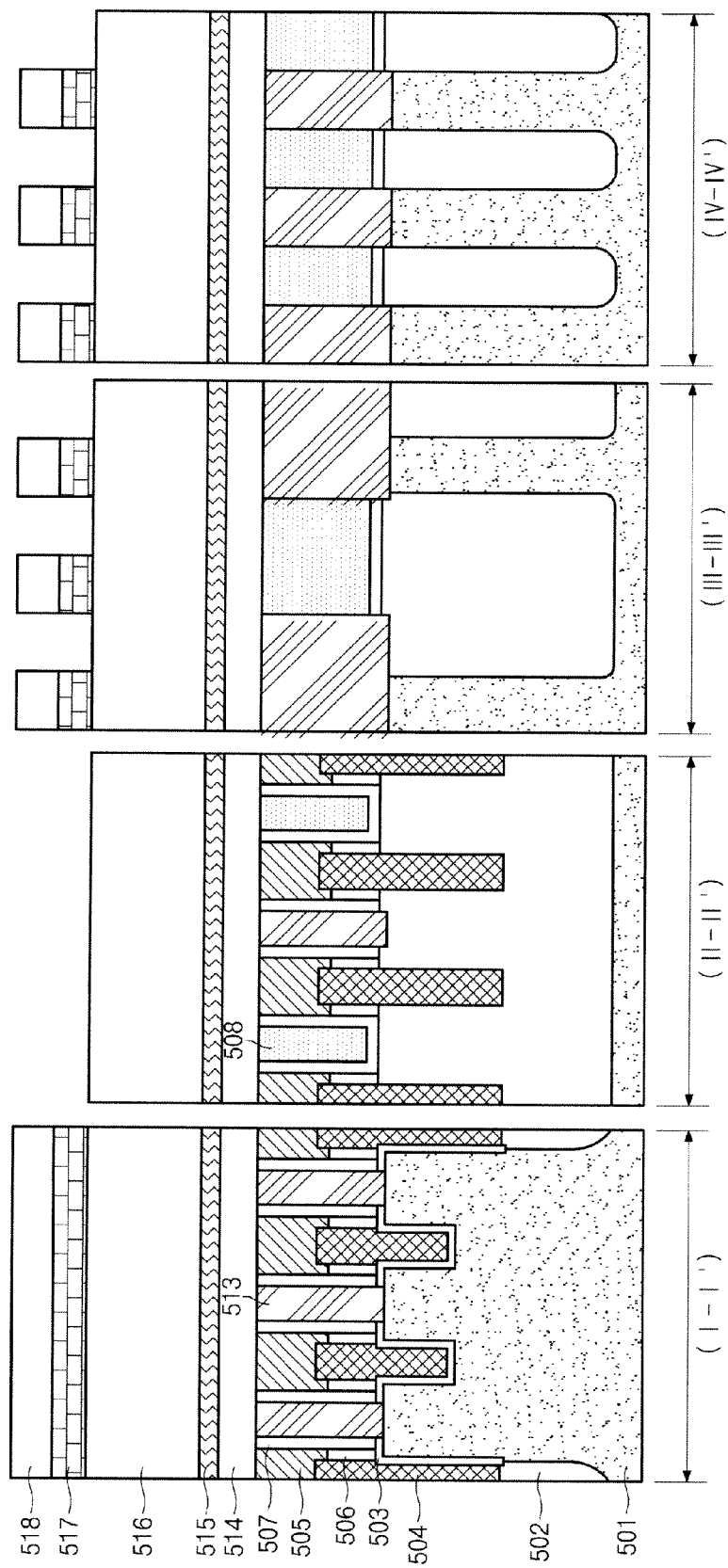

Referring to FIG. 5h, a third photoresist film 518 is coated over the third bit line hard mask film 517. The third bit line hard mask film 517 is etched with the third photoresist film 518 patterned with the bit line mask shown in FIG. 4f.

Figure 5I:
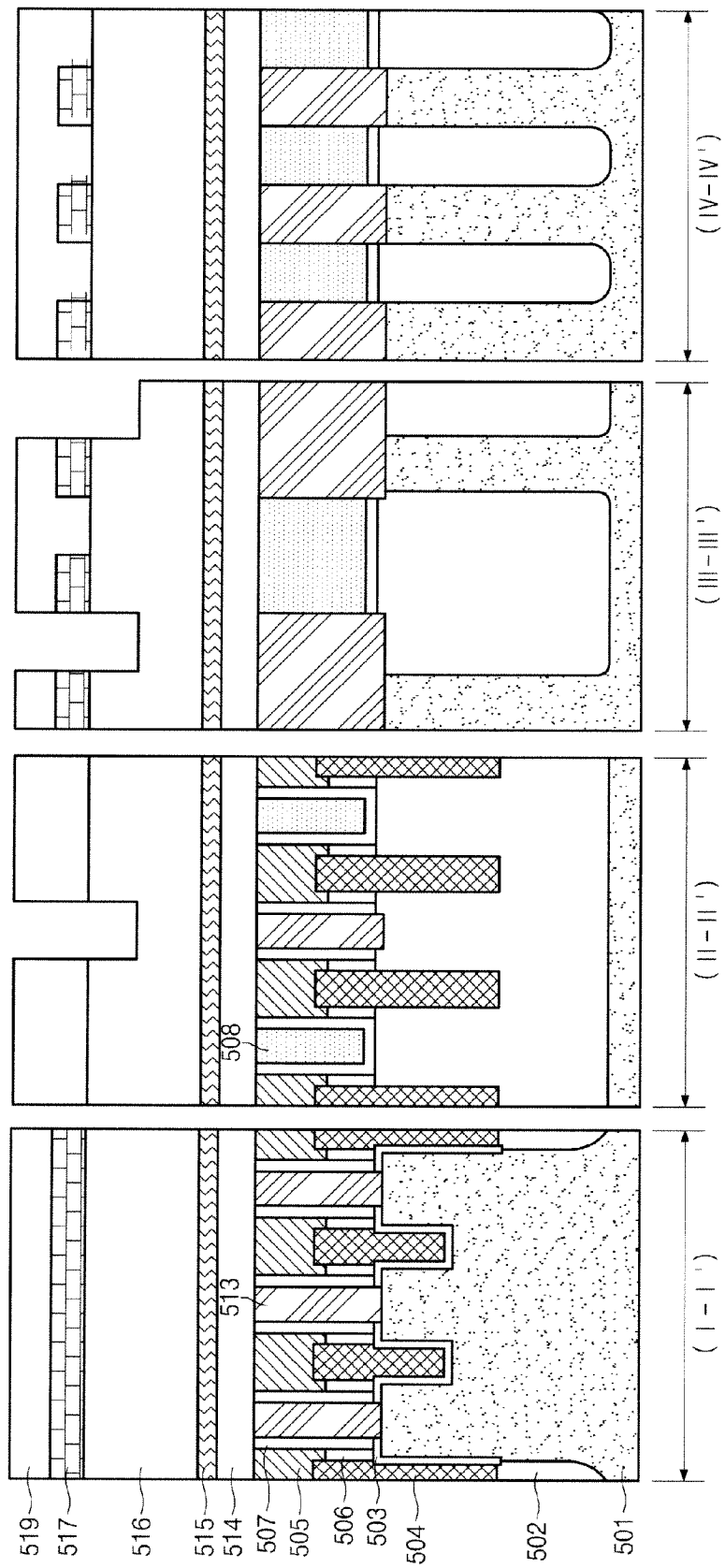

As shown in FIG. 5i, the third photoresist film 518 is removed, and a fourth photoresist film 519 is coated. The fourth photoresist film 519 is patterned with the bit line contact mask shown in FIG. 4f, and the second bit line hard mask film 516 is partially etched with the fourth photoresist film 519.

Figure 5J:
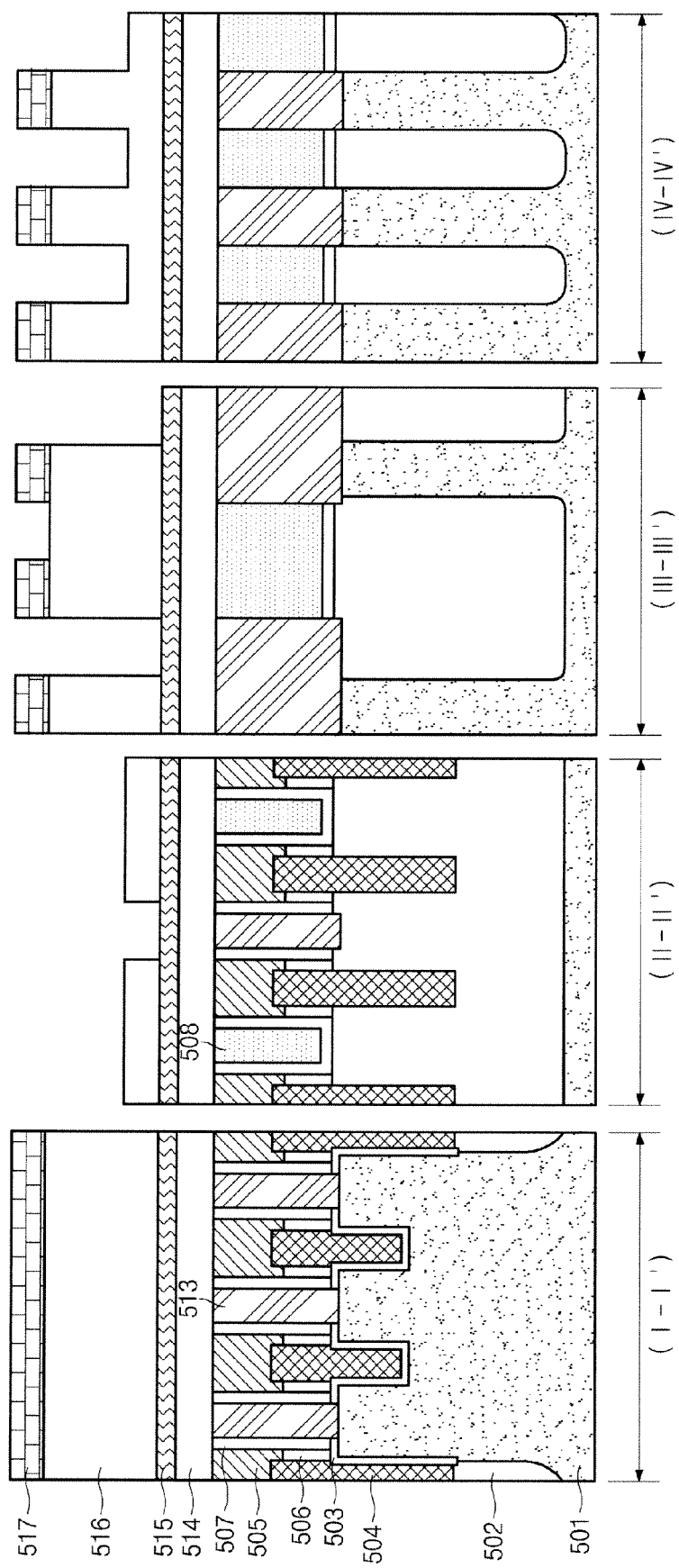

The fourth photoresist film 519 is removed. As shown in FIG. 5j, the second bit line hard mask film 516 is etched with the third bit line hard mask film 517. The second bit line hard mask film 516 is adjusted to be etched with a uniform thickness, thereby completely removing the second bit line hard mask film 516 of the region which is partially etched with the bit line contact mask in FIG. 5i. As a result, the first bit line hard mask film 515 is exposed, and the second bit line hard mask film 516 of the other regions remains corresponding to the etched thickness of the second bit line hard mask film 516 in FIG. 5i.

Figure 5K:
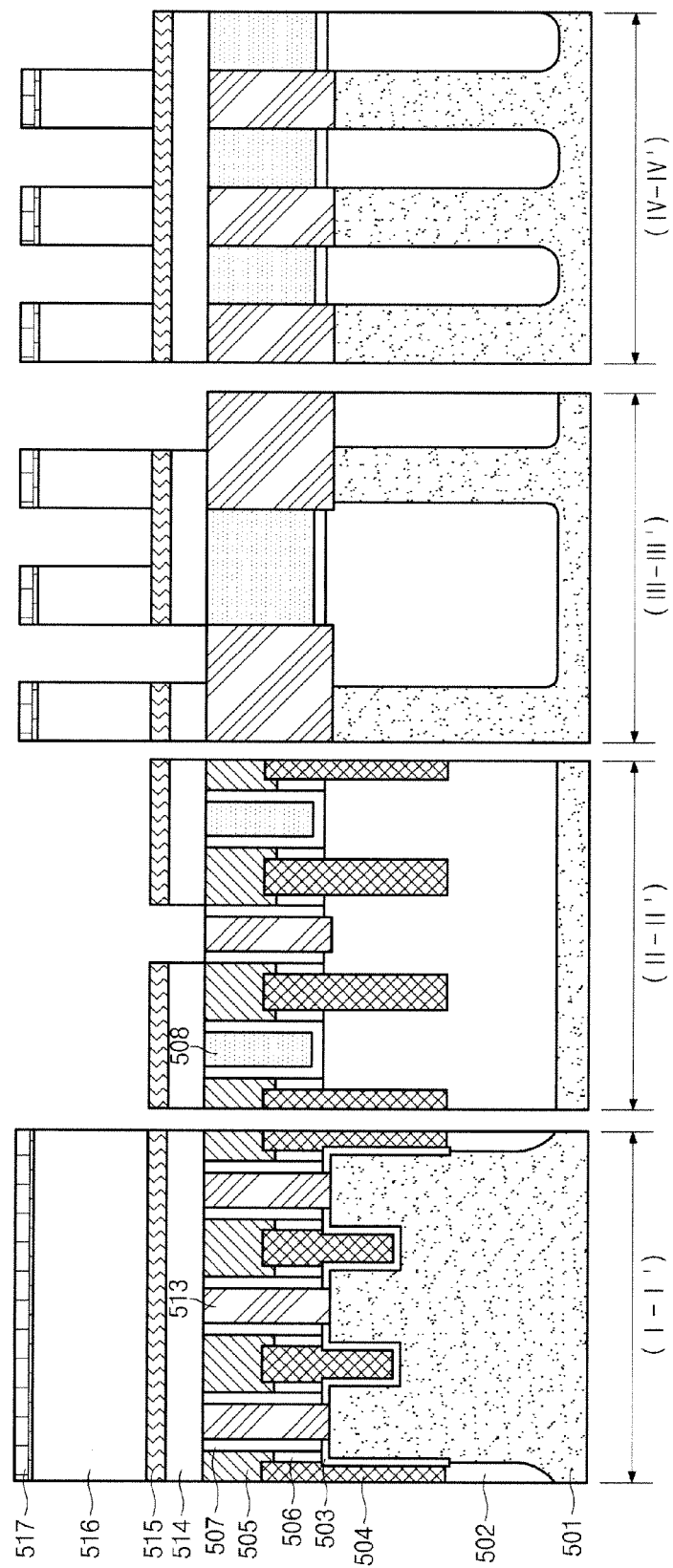
Figure 51:
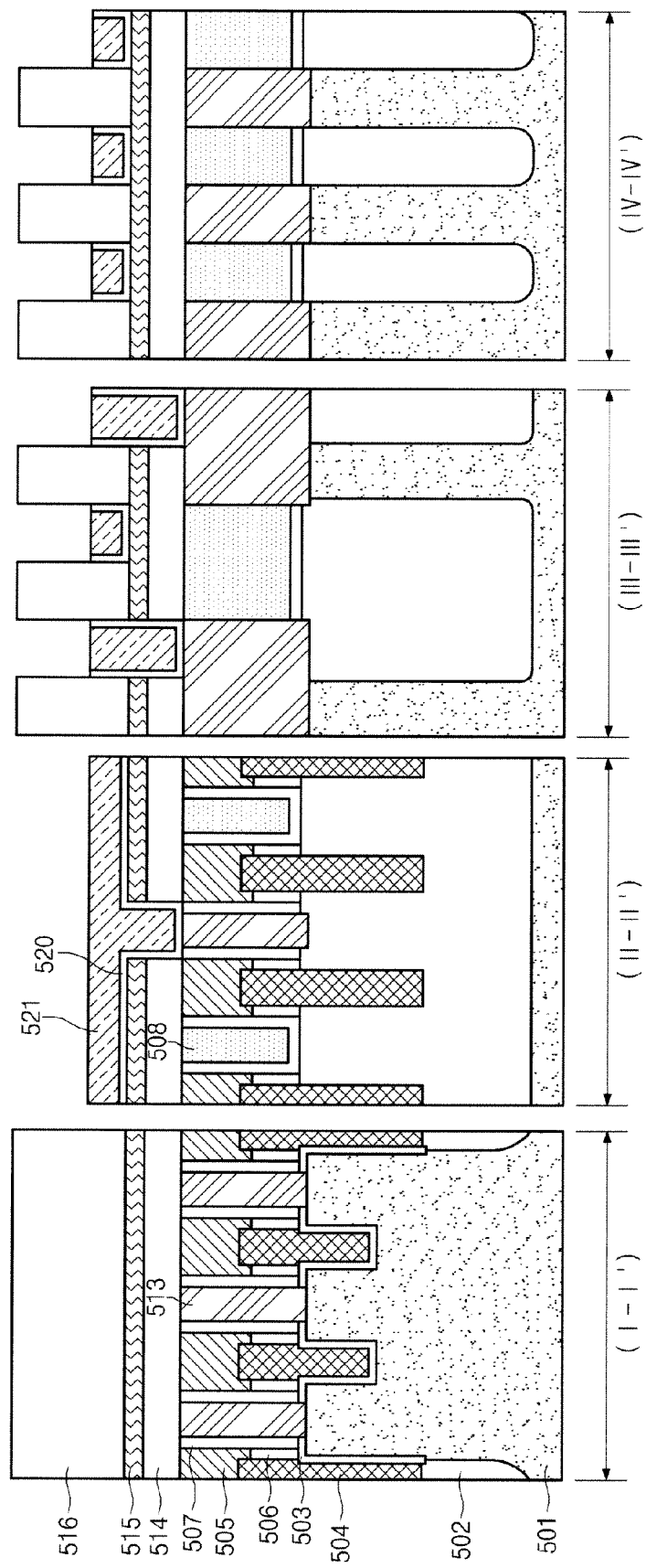

As shown in FIG. 5k, the first bit line hard mask film 515 and the second interlayer insulating film 514 are etched with the third bit line hard mask film 517 to expose the polysilicon film 513 formed as a plug. The second bit line hard mask film 516, which is not etched with the third bit line hard mask film 517 but remains with a given thickness, is removed.

As shown in FIG. 5l, the third bit line hard mask film 517 is removed. A bit line barrier metal film 520 is formed with a given thickness in the region etched between the second bit line hard mask films 516. A Rapid Thermal Annealing (RTA) process for improving a characteristic of the contact surface may be performed on the bit line barrier metal film 520. A bit line material is deposited over the bit line barrier metal film 520, which is thermally treated, to form a bit line 521. A CMP or other suitable process may be performed on the bit line 521. An etch-back process is performed on the exposed bit line barrier metal film 520 and the upper portion of the bit line 521 to determine the thickness of the bit line 521.

Figure 5M:
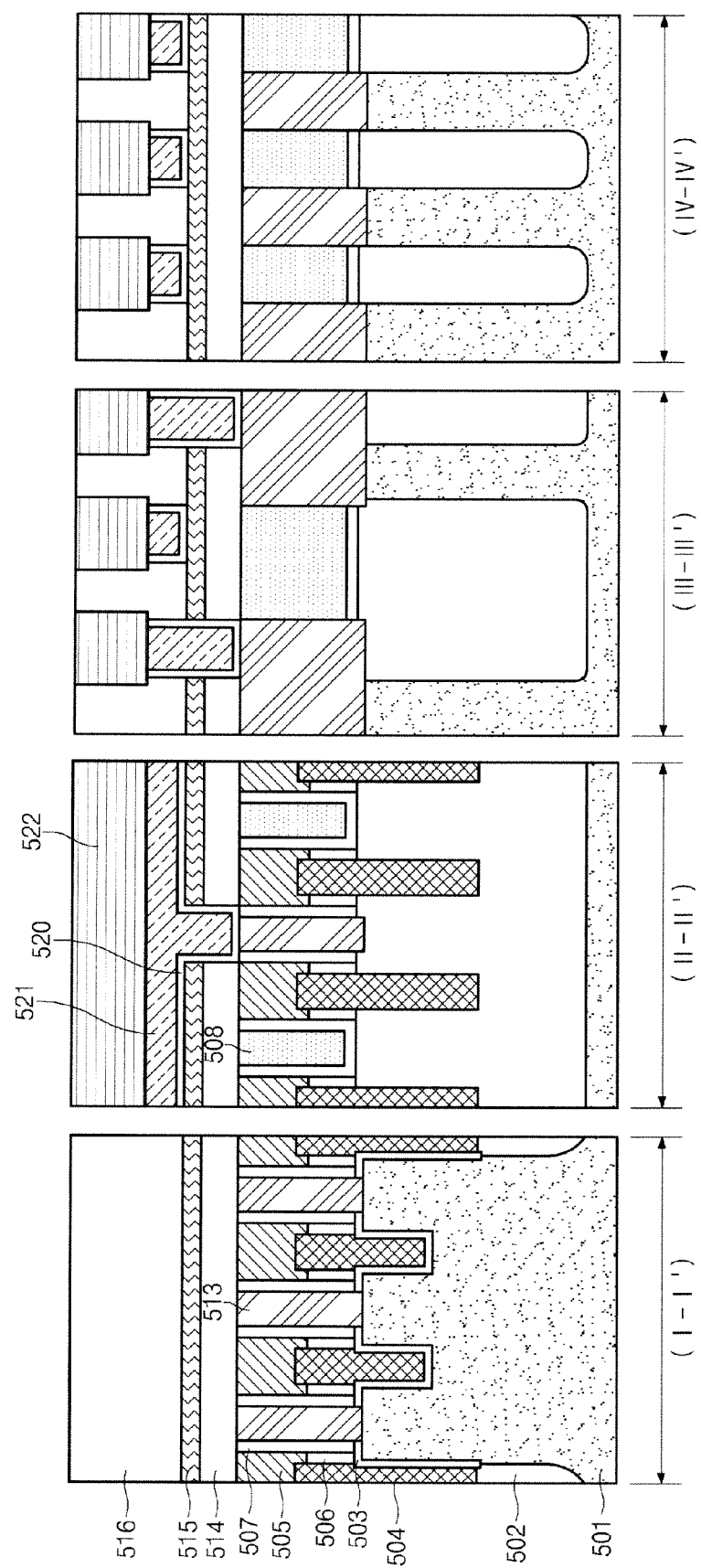
Figure 6A:
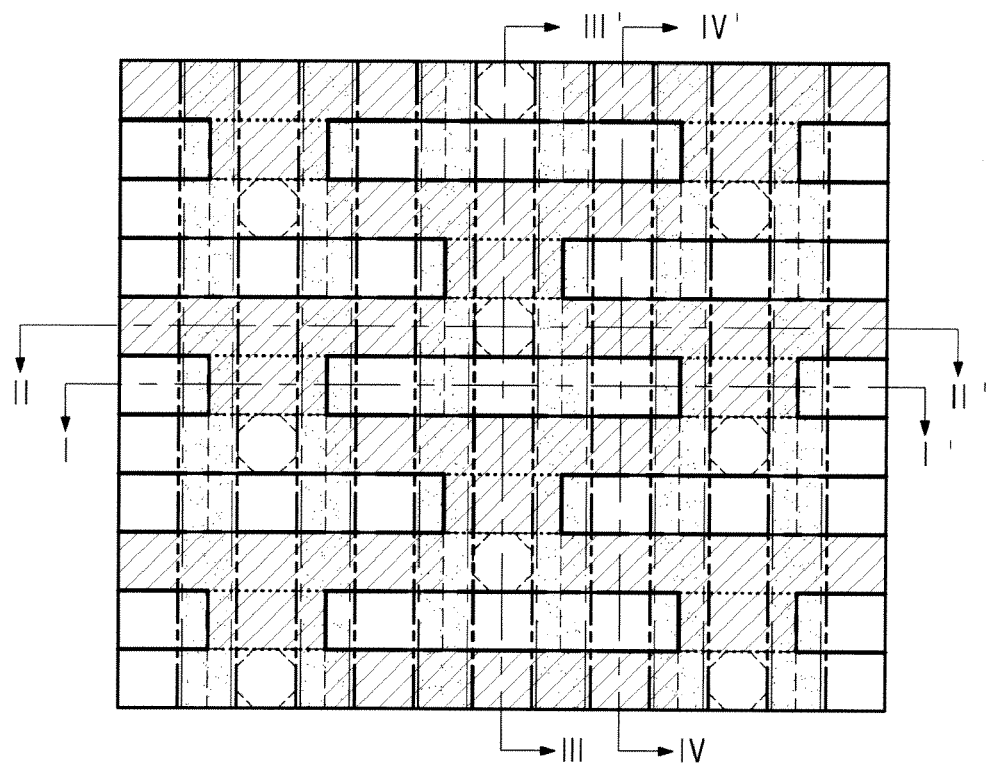
FIG. 6 is a plane diagram illustrating a mask pattern for manufacturing a semiconductor memory apparatus according to another embodiment of the present invention.
Figure 6B:
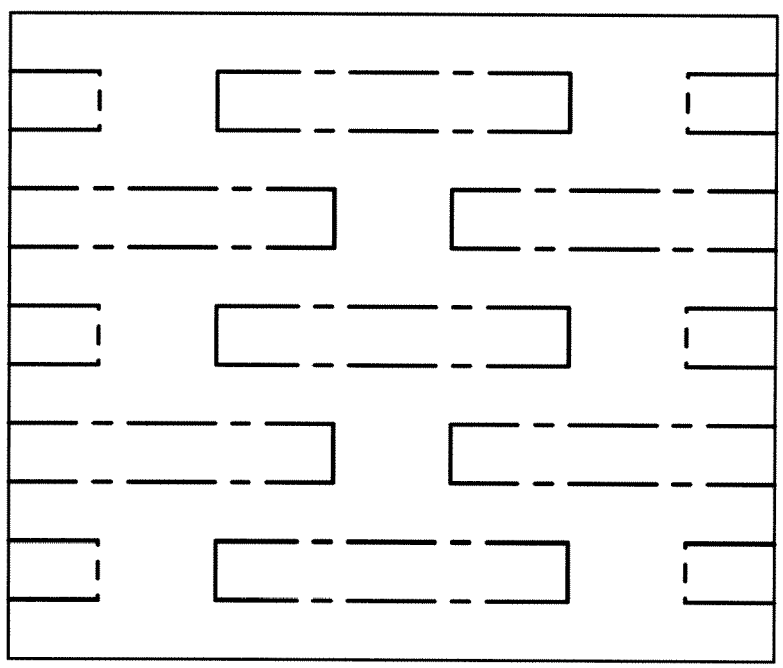
Figure 6C:
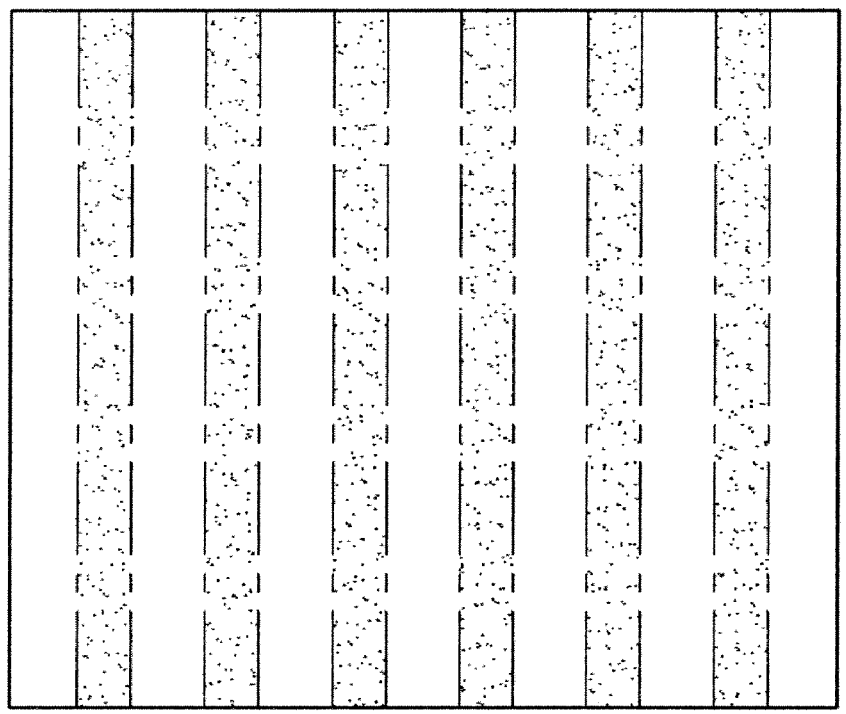
Figure 6D:
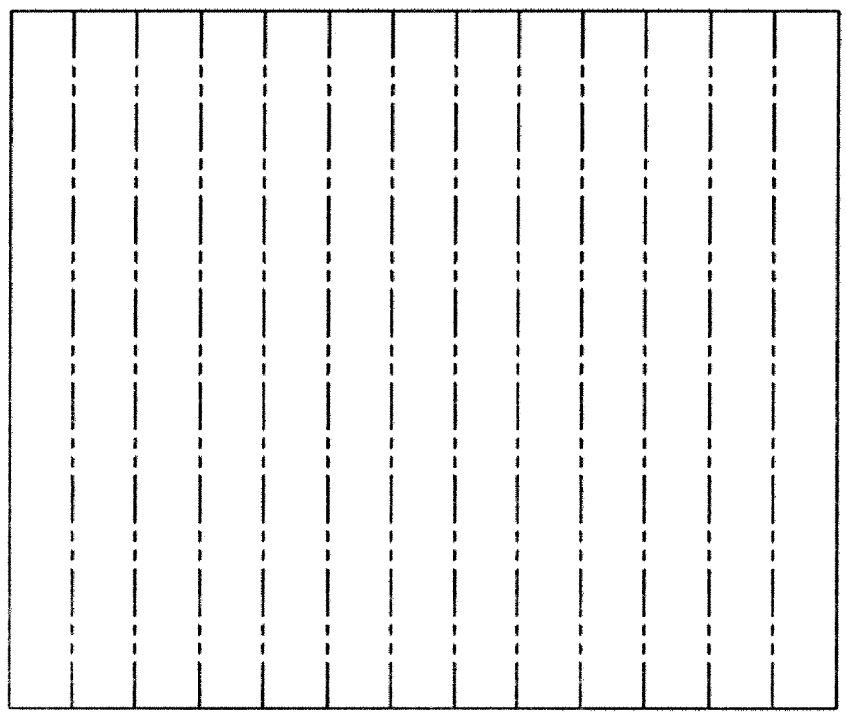
Figure 6E:
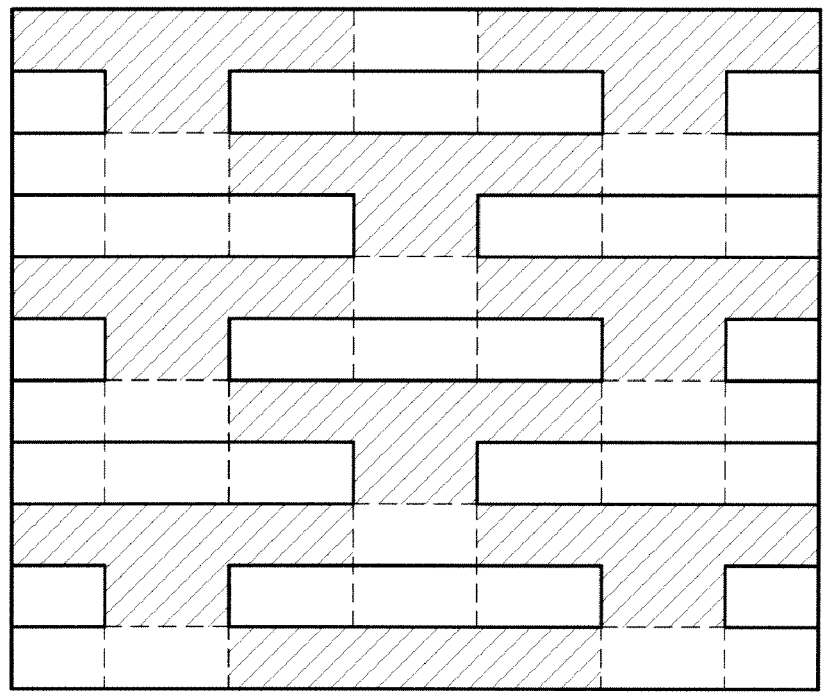
Figure 6F:
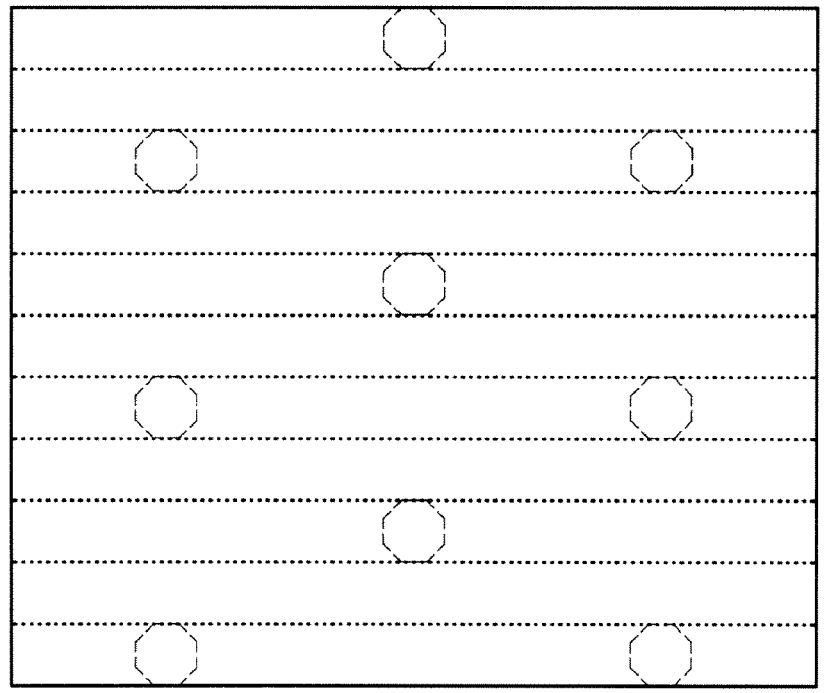

Referring to FIG. 5m, a wet etch process may be performed with the space etched by an etch-back or other suitable process to expose a portion of the second bit line hard mask film 516, thereby enlarging the etched space. A bit line hard mask nitride film 522 is deposited over the etched space to fill the etched space. A CMP process is performed to planarize the upper surface of the second bit line hard mask film 516 and the bit line hard mask nitride film 522.

A storage node (SN) contact (not shown) in the unit cell may be formed over the active region in which the bit line 516 is not formed. A capacitor and a line including a metal layer are formed over the SN contact to obtain a cell array in the semiconductor memory apparatus.

As for the plug and the bit line contact, referring to FIGS. 5l and 5m, the polysilicon film 513 is not formed in the region 'F' shown in FIG. 2e, but the plug and the bit line contact are arranged vertical to the polysilicon film 513 and the bit line barrier metal film 520 of the bit line contact region. As a result, the parasite capacitance increased in the bit line adjacent to the gate pattern by the polysilicon film formed in an unnecessary region can be reduced because the hard mask film is etched with the SN plug mask and the bit line plug mask, as shown in FIG. 4e, and to secure a region in which a plug is formed.

Figure 2G:
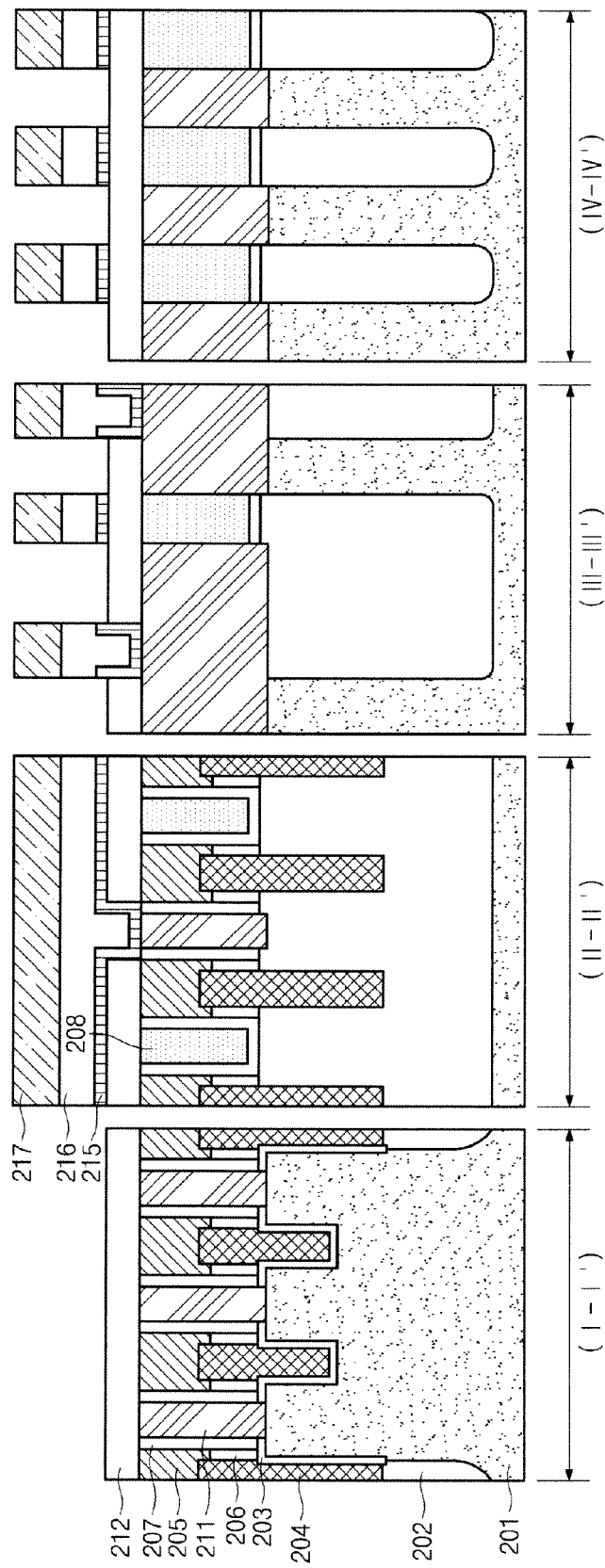

In the conventional art, after the region in which the bit line contact is formed is secured, the bit line material is deposited, a new photoresist film is coated, and the bit line material is etched with the bit line mask. However, when two individual photo processes are performed there is the possibility of mis-alignment of the bit line contact mask and the bit line mask, and a resistance of the contact surface is increased. For example, when mis-alignment occurs in the etching process of FIG. 2g, the bit line contact is etched to reduce the contact surface. However, in the present invention, after the region in which the bit line is formed is secured to determine a region in which the bit line contact is formed, the bit line material is deposited, thereby preventing the reduction of the contact surface due to mis-alignment.

Figure 2H:
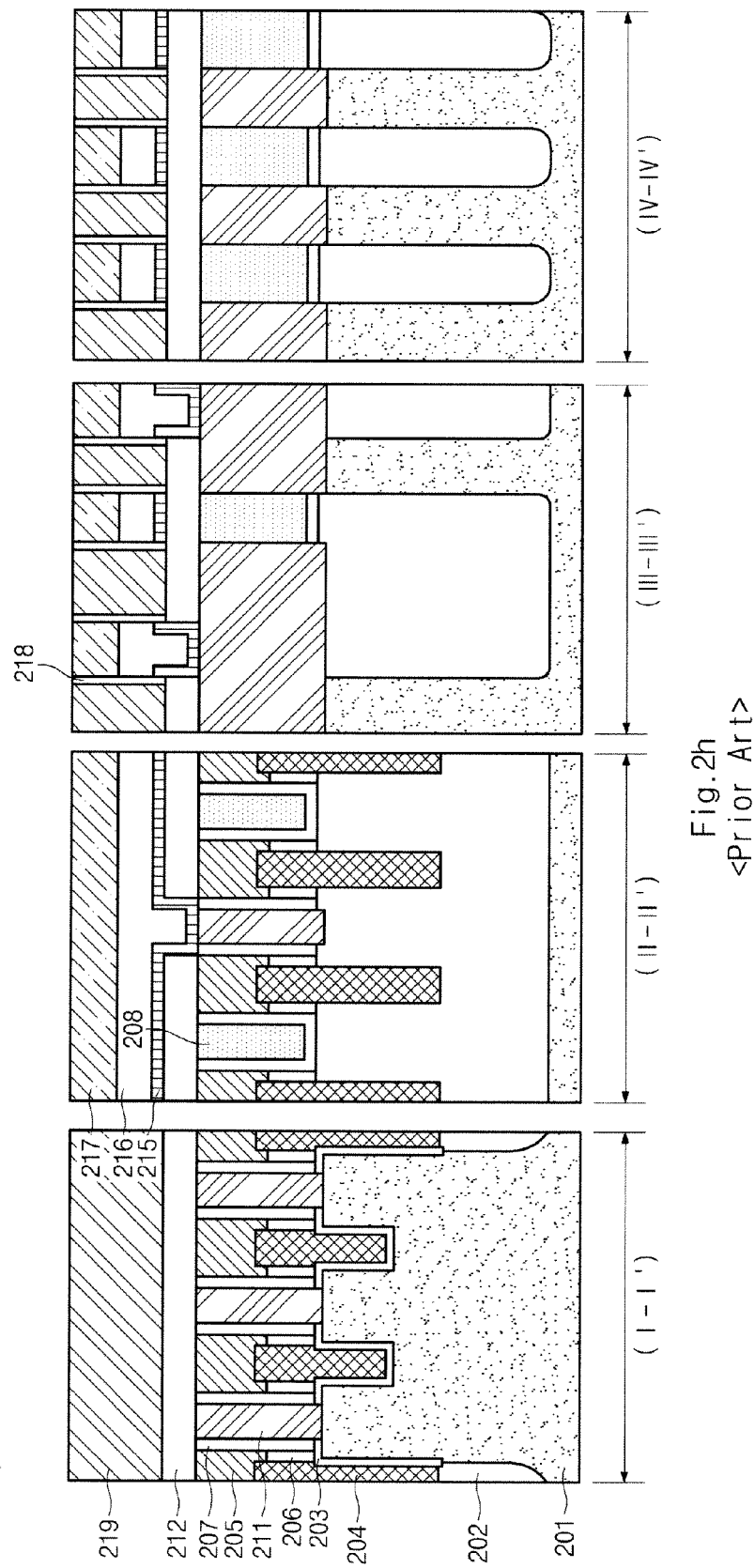

Furthermore, after the bit line 216 is formed, the bit line nitride film 218 is additionally formed on the sidewalls of the bit line pattern, as shown in FIG. 2h, for insulation between the bit line patterns in the conventional art. However, processes in accordance with preferred embodiments of the present invention, it is unnecessary to form the bit line nitride film 218. The second bit line hard mask film 516 formed between the bit line patterns serves as an insulating material between the bit line patterns. The second bit line hard mask film 516 may include a nitride oxide film or an oxide film which has a lower dielectric constant than that of the bit line nitride film 218, thereby reducing the parasite capacitance of the bit line.

FIG. 6 is a plane diagram illustrating a mask pattern for manufacturing a semiconductor memory apparatus according to another embodiment of the present invention.

Referring to FIG. 6, the SN plug mask selected from the SN plug mask (represented by solid lines) and the bit line plug mask (represented by dotted lines) used as plug masks, respectively, is different from the SN plug mask of FIG. 4e. Specifically, while the SN plug mask of FIG. 4e has a shape in which chrome is removed so that light can be transmitted into the region corresponding to the storage node, the SN plug mask of FIG. 6 has a similar shape to that of the ISO mask but the remaining chrome that prevents light from entering the ISO mask is on the opposite side of the ISO mask. That is, the SN plug mask has a shape opposite to that of the ISO mask shown in FIG. 4b, thereby facilitating the formation of the SN plug mask.

The SN plug mask and the bit line contact plug mask may both be used in order to secure a plug region potentially preventing the generation of errors in the process. That is, when the SN plug mask and the bit line contact plug mask shown in FIGS. 4e and 6 are used, the region in which the polysilicon film is formed is the same. When the SN plug mask and the bit line plug mask shown in FIG. 6 are used, other masks (that is, the ISO mask, the fin mask, the gate mask, the bit line contact mask, and the bit line mask shown in FIGS. 4b, 4c, 4d and 4f) use the same region.

As described above, according to an embodiment of the present invention, a mask pattern is used for manufacturing a semiconductor memory apparatus including a SN plug mask for defining a portion of a plug forming region to connect a bit line to an active region of a cell transistor and a bit line plug mask for defining the rest portion of the plug forming region. Specifically, the regions exposed by the SN plug mask and the bit line plug mask are not overlapped but may contact with each other as shown in FIG. 4e, and the regions exposed by the SN plug mask and the bit line plug mask are partially overlapped as shown in FIG. 6.

Moreover, polysilicon that is over-deposited over an unnecessary region due to usage of the conventional plug mask is removed, but the plug region is clarified to reduce the parasite capacitance generated in bit lines. Also, regions of a bit line contact and a bit line are defined and formed together to reduce mis-alignment between the mask patterns, thereby decreasing increase in resistance and defects generated from the mis-alignment between the mask patterns. Furthermore, a hard mask insulating film including a nitride oxide film or an oxide film is formed on sidewalls of a bit line and a bit line barrier metal film when the bit line contact and the bit line are formed, thereby reducing a dielectric constant of a bit line sidewall insulating film to decrease the parasite capacitance of the bit lines.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of manufacturing a semiconductor memory apparatus comprising:
    forming a first pattern using a storage-node plug mask defining a storage-node plug region;
    etching the first pattern with a bit line plug mask defining a bit line plug region to form a second pattern defining a plug region; and
    etching an insulation layer between gates with the second pattern to determine a plug region.

2. The method according to claim 1, further comprising:
    forming a gate pattern of a cell transistor and depositing the insulation layer over a structure including the gate pattern; and
    forming a hard mask layer over the insulation layer.

3. The method according to claim 2, wherein forming the second pattern includes:
    etching the hard mask layer through photo lithography with the storage-node plug mask; and
    etching the hard mask layer etched by the storage-node plug mask through photo lithography with the bit line plug mask.

4. The method according to claim 1, further comprising forming a conductive layer in the plug region.

5. The method according to claim 1, wherein regions respectively exposed by each of the storage-node plug mask and the bit line plug mask are not overlapped.

6. The method according to claim 5, wherein an upper part over an active region of a cell transistor is exposed by the storage-node plug mask.

7. The method according to claim 1, wherein regions respectively exposed by each of the storage-node plug mask and the bit line plug mask are partially overlapped, and a region exposed by the storage-node plug mask is diametrically opposed to a region exposed by an ISO mask determining an active region of a cell transistor.

8. The method according to claim 1, further comprising forming a bit line and a bit line contact simultaneously by depositing a conductive material in both a first region for the bit line contact and a second region for the bit line, wherein the first region is formed over plug contact.

9. The method according to claim 8, wherein one side of the first region is aligned with that of the plug contact.

10. The method according to claim 8, wherein the forming the bit line and a bit line contact simultaneously includes:
   making the second region through a first etching process with a bit line mask;
   making the first region in the second region through a second etching process with a bit line contact mask;
   forming a barrier metal layer over a bottom and sidewalls of the first and second regions;
   filling up the conductive material into the first and second regions; and
   etching back the conductive material until the conductive material remains with a predetermined thickness.

11. The method according to claim 10, wherein the first and the second regions are formed through a self-aligned etching process after a plurality of bit line hard mask layers are formed.

12. The method according to claim 11, wherein forming the bit line and a bit line contact simultaneously further includes:
   etching to enlarge a space which results from the etch-back process over the conductive material; and
   forming a bit line hard mask nitride layer in the space, thereby guarding the bit line.

13. A method for manufacturing a semiconductor memory apparatus, comprising:
   forming a first pattern using a storage-node plug mask defining a storage-node plug region;
   etching the first pattern with a bit line plug mask defining a bit line plug region to form a second pattern defining a plug region;
   etching an insulation layer between gates with the second pattern to determine a plug region;
   depositing a conductive layer in the plug region to form a plug; and
   forming a bit line and a bit line contact simultaneously by depositing a conductive material in a region resulting from etching a hard mask layer formed over the plug by using a bit line contact mask and a bit line mask.

14. The method according to claim 13, wherein forming the second pattern includes:
   etching the hard mask layer through photo lithography with the storage-node plug contact mask; and
   etching the hard mask layer etched by the storage-node plug mask through photo lithography with the bit line plug mask.

15. The method according to claim 13, wherein one side of the plug contact is aligned with that of a region etched with the bit line contact mask.

16. The method according to claim 13, wherein forming the bit line and a bit line contact simultaneously includes:
   etching the hard mask layer by using the bit line mask and the bit line contact mask subsequently;
   filling up the conductive material into a region formed through the etching the hard mask layer; and
   etching back the conductive material until the conductive material remains with a predetermined thickness.

17. A method of manufacturing a semiconductor memory apparatus comprising:
   forming a first pattern using a bit line plug mask defining a bit line plug region;
   etching the first pattern with a storage-node plug mask defining a storage-node plug region to form a second pattern defining a plug region; and
   etching an insulation layer between gates with the second pattern to determine a plug region.

* * * * *